US012652786B2

(12) United States Patent
    Alva et al.

(10) Patent No.: US 12,652,786 B2
(45) Date of Patent: Jun. 9, 2026

(54) VACUUM-BASED ATTACHMENT FOR HEAT SINK AND RADIATION SHIELD

(71) Applicant: Intel Corporation, Santa Clara, CA (US)

(72) Inventors: Samarth Alva, Bangalore (IN); Juha Tapani Paavola, Hillsboro, OR (US); Arnab Sen, Bangalore (IN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/074,701

(22) Filed: Dec. 5, 2022

(65) Prior Publication Data

US 2023/0097977 A1     Mar. 30, 2023

(51) Int. Cl.
    *H05K 9/00*       (2006.01)
    *H05K 1/02*       (2006.01)
(52) U.S. Cl.
    CPC ......... *H05K 9/0032* (2013.01); *H05K 1/0204* (2013.01); *H05K 1/0216* (2013.01); *H05K 2201/066* (2013.01); *H05K 2201/10371* (2013.01)
(58) Field of Classification Search
    CPC .. H05K 9/0032; H05K 1/0204; H05K 1/0216;

H05K 2201/066; H05K 2201/10371; H05K 2201/1056; H05K 1/0209; H05K 2201/2018; H05K 2201/2036
    See application file for complete search history.

(56)     References Cited

U.S. PATENT DOCUMENTS

| | | | | |
|---|---|---|---|---|
| 5,898,127 A * | 4/1999 | Schuhmacher | ...... | H05K 9/0015 |
| | | | | 174/382 |
| 2003/0193794 A1 * | 10/2003 | Reis | ...... | H05K 9/0028 |
| | | | | 257/E23.114 |
| 2013/0208422 A1 * | 8/2013 | Hughes | ...... | G06F 1/20 |
| | | | | 361/700 |
| 2017/0110411 A1 * | 4/2017 | Meyer, IV | ...... | H01L 23/3675 |

* cited by examiner

*Primary Examiner* — Jacob R Crum
(74) *Attorney, Agent, or Firm* — Banner & Witcoff, Ltd.

(57)               ABSTRACT

Particular embodiments described herein provide for an electronic device can include a support structure, a radiation source on the support structure, and a radiation shield around the radiation source. The radiation shield includes a wall secured to the support structure, a vacuum bag on the wall, where the vacuum bag has an inside air pressure less than an air pressure outside the vacuum bag, and a lid. The air pressure inside the vacuum bag is less than the atmospheric pressure outside the vacuum bag. When the vacuum is created in the vacuum bag, the vacuum bag deforms and compresses to help provide a vacuum-based mechanical loading that helps to create an applied load on the one or more radiation sources by the lid.

20 Claims, 14 Drawing Sheets

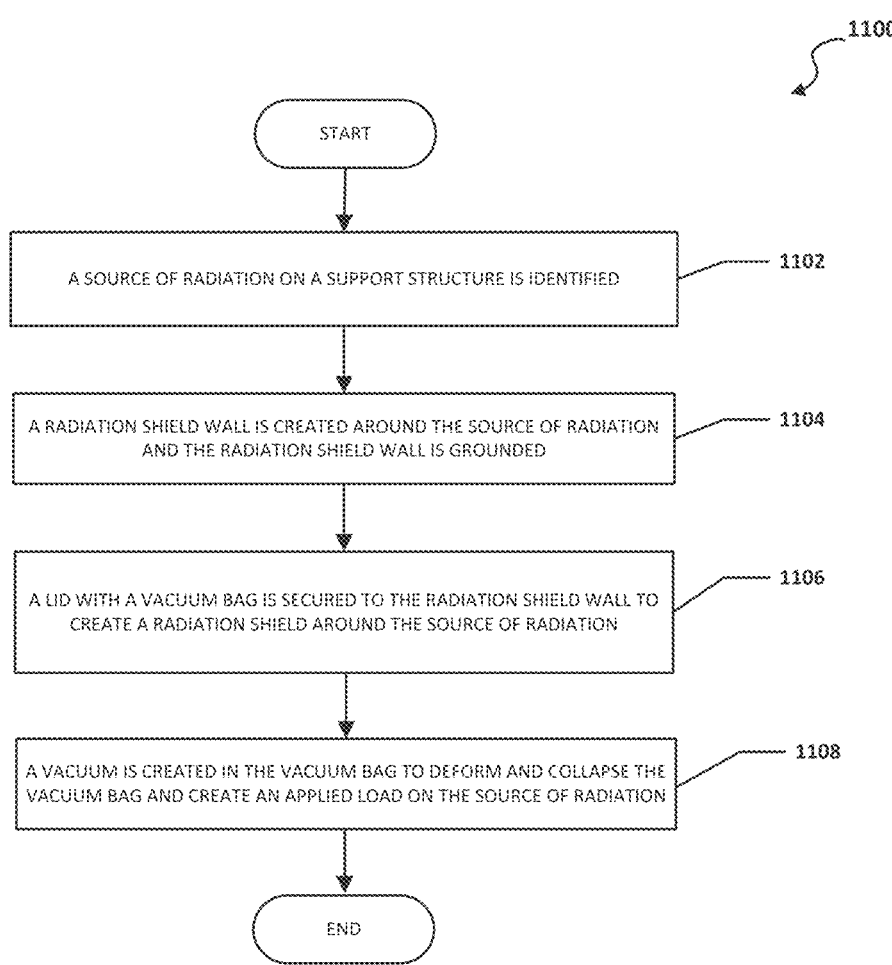

1100

START

A SOURCE OF RADIATION ON A SUPPORT STRUCTURE IS IDENTIFIED — 1102

A RADIATION SHIELD WALL IS CREATED AROUND THE SOURCE OF RADIATION AND THE RADIATION SHIELD WALL IS GROUNDED — 1104

A LID WITH A VACUUM BAG IS SECURED TO THE RADIATION SHIELD WALL TO CREATE A RADIATION SHIELD AROUND THE SOURCE OF RADIATION — 1106

A VACUUM IS CREATED IN THE VACUUM BAG TO DEFORM AND COLLAPSE THE VACUUM BAG AND CREATE AN APPLIED LOAD ON THE SOURCE OF RADIATION — 1108

END

FIGURE 11

VACUUM-BASED ATTACHMENT FOR HEAT SINK AND RADIATION SHIELD

TECHNICAL FIELD

This disclosure relates in general to the field of computing, and more particularly, to a vacuum-based attachment for a heat sink and a radiation shield.

BACKGROUND

Emerging trends in systems place increasing performance demands on the system. One way to attempt to improve performance and function is to increase the density of the devices and systems and pack more computing elements into the devices and systems. The increasing performance demands can create a relatively crowded system as more and more components are located in close proximity to each and can cause radiating noise level increases in the system. More specifically, the increase in computing elements often causes elevated noise levels in systems. Electromagnetic interference (EMI) and radio-frequency interference (RFI) affect almost every electronic device, especially mobile compute devices. In addition, some electrical components are both a source of electromagnetic and radio-frequency radiation and are susceptible to EMI/RFI from adjacent sources. The radiating noise level can cause a reduction in device performance, a reduction in the lifetime of a device, and/or delays in data throughput.

BRIEF DESCRIPTION OF THE DRAWINGS

To provide a more complete understanding of the present disclosure and features and advantages thereof, reference is made to the following description, taken in conjunction with the accompanying figures, wherein like reference numerals represent like parts, in which:

FIG. 11 is a simplified flowchart illustrating potential operations that may be associated with the system in accordance with an embodiment of the present disclosure;

Figure 1A:
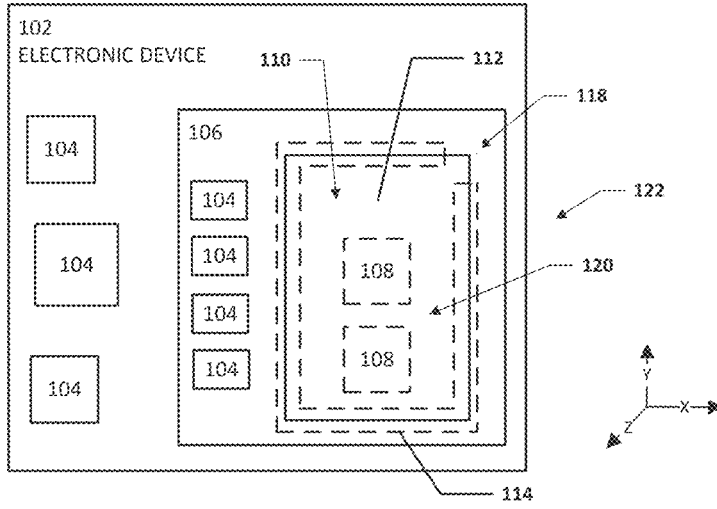
FIGS. 1A-1C are simplified block diagrams of a system to enable a vacuum-based attachment for a heat sink and a radiation shield, in accordance with an embodiment of the present disclosure.

The FIGURES of the drawings are not necessarily drawn to scale, as their dimensions can be varied considerably without departing from the scope of the present disclosure.

DETAILED DESCRIPTION

Example Embodiments

The following detailed description sets forth examples of apparatuses, methods, and systems relating to enabling a vacuum-based attachment for a heat sink and a radiation shield. Features such as structure(s), function(s), and/or characteristic(s), for example, are described with reference to one embodiment as a matter of convenience; various embodiments may be implemented with any suitable one or more of the described features.

Overview

In an example, a vacuum-based attachment for a heat sink and a radiation shield can be over one or more radiation sources on a support structure (e.g., a printed circuit board). The one or more radiation sources can be a heat source (e.g., a processor or some other heat source that also generates radiation, particularly electromagnetic radiation and/or radio-frequency radiation). The radiation shield can include a lid, a vacuum bag, and radiation shield wall. The radiation shield wall can be coupled to the ground plane of the support structure so that the lid, the vacuum bag, and the radiation shield wall are all grounded. The lid can be a heat sink and more particularly a vapor chamber or cold plate.

The vacuum bag can be comprised of a conductive material that will deform and collapse when a vacuum is created inside the vacuum bag. The vacuum bag can be between the lid and the radiation shield wall and when a vacuum is created in the vacuum bag, the vacuum bag can help provide a vacuum-based mechanical loading that helps to create an applied load on the one or more radiation sources by the lid.

More specifically, when the vacuum is created inside the vacuum bag, the vacuum bag will deform and collapse. Because the vacuum bag is secured to the radiation shield wall and the radiation shield wall are secured to the support structure, the deformation and collapse of the vacuum bag causes the lid, which is attached to the vacuum bag, to move in the direction of the radiation source on the support structure and thermal interface material (TIM) over the radiation source and create an applied load on the TIM and the radiation source. The greater the size of the vacuum bag and/or the greater the vacuum created in the vacuum bag, the greater the applied load on the TIM and the radiation source. The lid, the vacuum tube, and the radiation shield wall are grounded and together create the radiation shield and can help provide an integrated shielding mechanism along with a loading action on the radiation source without creating holes on support structure. In some examples, the support structure is a printed circuit board (PCB), mainboard, or motherboard.

In an example, the vacuum bag does not extend the entire length around the radiation shield wall and there is a gap to allow an environment inside the radiation shield to have the same pressure as an environment outside of the radiation shield. The gap allows for pressure equalization to help ensure the environment inside the radiation shield is atmospheric or about the same as the environment outside of the radiation shield. By keeping the pressure of the environment inside of the radiation shield atmospheric or about the same as the environment outside of the radiation shield, the risk of vaporization of the TIM can be reduced as any TIM between the radiation sources and the lid will not be subjected to sub-atmospheric pressure. The vacuum bag can be hermetically sealed to help prevent the penetration of liquid vapor into the vacuum bag.

The electronic device can include a support structure, a radiation source on the support structure, and a radiation shield around the radiation source. The radiation shield includes a wall secured to the support structure, a vacuum bag on the wall, where the vacuum bag has an inside air pressure less than an air pressure outside the vacuum bag, and a lid. For example, the air pressure inside the vacuum bag can be equal to or less than 0.9 atmospheric pressure. In some examples, the radiation source is a heat source, the lid is a cold plate or vapor chamber, and TIM can be between the radiation source and the lid. The vacuum bag does not fully extend around the wall to allow an environment inside the radiation shield to have the same pressure as an environment outside of the radiation shield. In some examples, the vacuum bag is secured to the wall using a securing hook that extends into the wall. In other examples, the vacuum bag is secured to the wall using magnets, solder, adhesive, tape, a weld, or some other type of fastener or coupling means that can secure the vacuum bag to the radiation shield wall.

In some examples, a method can include identifying a radiation source on a PCB, creating a wall around the radiation source, securing a vacuum bag to the wall, where a lid is secured to the vacuum bag, and creating a vacuum in the vacuum bag to deform and collapse the vacuum bag and cause an applied load to be generated on the radiation source from the lid. The method can also include coupling the wall to a ground plane in the PCB. In addition, the method can include plugging, capping, sealing, etc. a valve that was used to create the vacuum in the vacuum bag such that air cannot reenter the vacuum bag where, after the valve is plugged, capped, sealed, etc., the vacuum bag has an inside air pressure less than an air pressure outside the vacuum bag.

In the following description, various aspects of the illustrative implementations will be described using terms commonly employed by those skilled in the art to convey the substance of their work to others skilled in the art. However, it will be apparent to those skilled in the art that the embodiments disclosed herein may be practiced with only some of the described aspects. For purposes of explanation, specific numbers, materials, and configurations are set forth in order to provide a thorough understanding of the illustrative implementations. However, it will be apparent to one skilled in the art that the embodiments disclosed herein may be practiced without the specific details. In other instances, well-known features are omitted or simplified in order not to obscure the illustrative implementations.

The terms "over," "under," "below," "between," and "on" as used herein refer to a relative position of one layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "directly on" a second layer is in direct contact with that second layer. Similarly, unless explicitly stated otherwise, one feature disposed between two features may be in direct contact with the adjacent features or may have one or more intervening layers.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense. For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). Reference to "one embodiment" or "an embodiment" in the present disclosure means that a particular feature, structure, or characteristic described in connection with the embodiment is included in at least one embodiment. The appearances of the phrase "in one embodiment" or "in an embodiment" are not necessarily all referring to the same embodiment. The appearances of the phrase "for example," "in an example," or "in some examples" are not necessarily all referring to the same example. The term "about" indicates a tolerance of twenty percent (20%). For example, about one (1) millimeter (mm) would include one (1) mm and ±0.2 mm from one (1) mm. Similarly, terms indicating orientation of various elements, for example, "coplanar," "perpendicular," "orthogonal," "parallel," or any other angle between the elements generally refer to being within +/−5-20% of a target value based on the context of a particular value as described herein or as known in the art.

Example Radiation Shield with Vacuum-Based Attachment

Figure 1B:
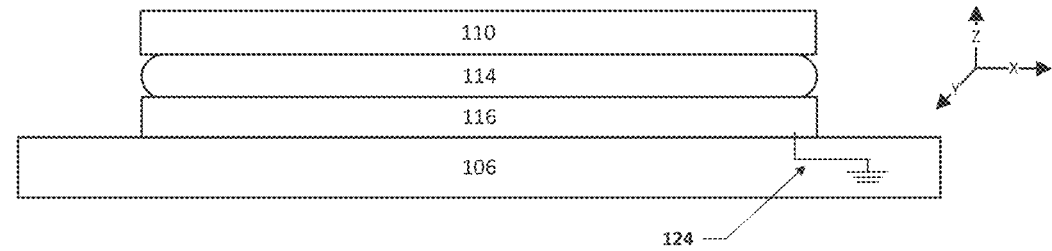
Figure 1C:
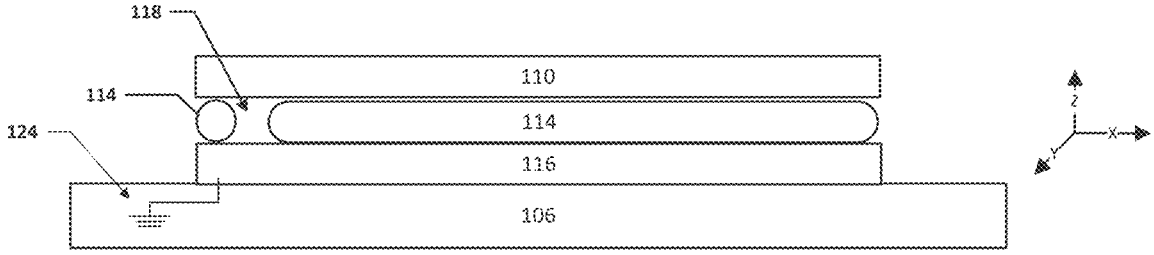

FIGS. 1A-1C are simplified block diagrams of an electronic device 102 configured with a vacuum-based attachment for a heat sink and a radiation shield, in accordance with an embodiment of the present disclosure. In an example, the electronic device 102 can include one or more electronics 104 and a support structure 106. The support structure 106 can include at least one of the one or more electronics 104, one or more radiation sources 108, and radiation shield 110, and a ground 124. The radiation shield 110 can include a lid 112, a vacuum bag 114, and radiation shield wall 116 (shown in FIGS. 1B and 1C). Each of the one or more electronics 104 can be a device or group of devices available to assist in the operation or function of the electronic device.

In an example, the support structure 106 can be a substrate and more particularly, a PCB. The ground 124 can be a ground plane of the PCB. The one or more radiation sources 108 can be on or over the support structure 106 and the radiation shield 110 can be over the one or more radiation sources 108. The one or more radiation sources 108 can be a heat source (e.g., a processor or some other heat source that also generates radiation, particularly electromagnetic radiation and/or radio-frequency radiation). The lid 112 can be a heat sink and more particularly a vapor chamber or cold plate. As used herein, the term "heat sink" includes a component or components that help to move heat away from the one or more radiation sources 108.

The vacuum bag 114 can be between the lid 112 and the radiation shield wall 116. If the lid 112 is a heat sink, the vacuum bag 114 can help provide a vacuum-based mechanical loading that helps to create an applied load on the one or more radiation sources 108 by the lid 112. The lid 112, the vacuum bag 114, and the radiation shield wall 116 can be comprised of one or more different kinds of conductive material (e.g., the lid 112 and radiation shield wall 116 can be comprised of a rigid or semi-rigid conductive material (as described below in more detail) and the vacuum bag 114 can be comprised of a conductive material that will deform and collapse when the vacuum is created inside the vacuum bag 114 (as described below in more detail). The radiation shield wall 116 can be coupled to the ground 124 such that the lid 112, the vacuum bag 114, and the radiation shield wall 116 are all grounded. The lid 112, the vacuum bag 114, and the radiation shield wall 116 create the radiation shield 110 and can help provide an integrated shielding mechanism along with a loading action on the one or more radiation sources 108 without creating holes in support structure 106.

The vacuum bag 114 can have an internal pressure that less than one (1) atmospheric pressure (ATM) such that a vacuum is created inside the vacuum bag 114. In an example, the pressure inside the vacuum bag 114 is equal to or below about 0.9 atmospheric pressure (ATM). In other examples, the pressure inside the vacuum bag 114 is equal to or less than about 0.5 ATM. In some examples, the pressure inside the vacuum bag 114 is between about 0.9 ATM to about 0.2 ATM and ranges therein (e.g., between about 0.7 ATM and about 0.5 ATM, or between about 0.6 ATM and about 0.3 ATM), depending on design choice and design constraints. More specifically, as described with reference to FIGS. 2A and 2B, when the vacuum is created inside the vacuum bag 114, the vacuum bag 114 will deform and collapse. Because the vacuum bag 114 is secured to the radiation shield wall 116 and the radiation shield wall 116 are secured to the support structure 106, the deformation and collapse of the vacuum bag 114 causes the lid 112, which is attached to the vacuum bag 114, to move in the direction of the radiation source 108, and thermal interface material (TIM) (e.g., the TIM 126 illustrated in FIGS. 2A and 2B) over the radiation source 108, and create an applied load on the TIM and the radiation source 108. The greater the size of the vacuum bag 114 and/or the greater the vacuum created in the vacuum bag 114, the greater the applied load on the TIM and the radiation source 108.

The vacuum bag 114 is coupled to the radiation shield wall 116 using a mechanical fastener, magnets, solder, adhesive, tape, a weld, or some other type of fastener or coupling means that can secure the vacuum bag 114 to the radiation shield wall 116. In an example, the vacuum bag

114 does not extend the entire length around the radiation shield wall 116 and there is a gap 118 to allow an environment inside the radiation shield 120 to have the same pressure as an environment outside of the radiation shield 122. The gap 118 allows for pressure equalization to help ensure the environment inside the radiation shield 120 is atmospheric or about the same as the environment outside of the radiation shield 122. By keeping the pressure of the environment inside the radiation shield 120 atmospheric or about the same as the environment outside of the radiation shield 122, any TIM between the radiation sources 108 and the lid 112 will not be subjected to sub-atmospheric pressure to help minimize vaporization of the TIM. The vacuum bag 114 can be hermetically sealed to help prevent the penetration of liquid vapor into the vacuum bag 114.

The gap 118 is small enough to block or at least substantially block radiation from the one or more radiation sources 108 from extending past the radiation shield 110. For example, if the radiation from the one or more radiation sources 108 is EMI radiation, the gap 118 can have a height and width that will block the EMI radiation or at least block a majority of the EMI radiation. In an illustrative example, if the radiation is EMI radiation, the height of the gap 118 can be less than about 2.5 mm and the width of the gap 118 can be less than about 2.5 mm to block the EMI radiation or at least block a majority of the EMI radiation. In a specific example, if the radiation is EMI radiation, the gap 118 can have a height less than about 2 mm and width less than about 2 mm.

In an example, the lid 112 and the radiation shield wall 116 can be comprised of a conducive material and can include stainless steel, copper, an alloy such as nickel copper, or some material that is conductive, rigid, and can help contain or mitigate the radiation from the one or more radiation sources 108 from extending past the radiation shield 110 or at least partially contain or mitigate the radiation from the one or more radiation sources 108 from extending past the radiation shield 110. The lid 112 and the radiation shield wall 116 may be comprised of the same material or the lid 112 may be comprised of a different material than the radiation shield wall 116. For example, the lid 112 may be comprised of a thermally and electrically conductive material and the radiation shield wall 116 may only be comprised of an electrically conductive material and not a thermally conductive material or of an electrically conductive material that is not as thermally conductive as the lid 112. The vacuum bag 114 can be comprised of a relatively thin metal foil, a rubber/polymer tube having a metallic coating on the outside of the rubber/polymer tube, or some other conductive material that will allow at least a portion of the vacuum bag 114 to deform and collapse when a vacuum is created in the vacuum bag 114. In some examples, the vacuum bag 114 includes an elastomeric material or some other material that helps to provide a structure to the vacuum bag 114 and helps the vacuum bag 114 deform and collapse in a controlled manner.

The radiation from the one or more radiation sources 108 may be electromagnetic radiation, internal and external Wi-Fi and cellular radio-frequency radiation, high speed input/output (I/O) trace/connector digital noise radiation, switching voltage regulator radiation, or some other type of radiation that can have an undesirable effect on one or more components of an electronic device. For example, electromagnetic interference (EMI) and radio-frequency interference (RFI) affect almost every electronic device, especially mobile compute devices. System on a chip (SoC) packages are both a source of electromagnetic radiation and radio-frequency radiation and are susceptible to EMI/RFI from adjacent sources. For example, when a smartphone is placed on or near a keyboard of a laptop, performance of the laptop is often impacted (e.g., laptop screen flicker, CPU hang, reboot of the system, etc.). The term "radiation" includes electromagnetic radiation, radio-frequency radiation, and other similar radiation that can cause an undesirable effect on one or more components of an electronic device.

It is to be understood that other embodiments may be utilized and structural changes may be made without departing from the scope of the present disclosure. Substantial flexibility is provided in that any suitable arrangements and configuration may be provided without departing from the teachings of the present disclosure.

For purposes of illustrating certain example techniques, the following foundational information may be viewed as a basis from which the present disclosure may be properly explained. End users have more media and communications choices than ever before. A number of prominent technological trends are currently afoot (e.g., more computing elements, more online video services, more Internet traffic, more complex processing, etc.), and these trends are changing the expected performance of devices as devices and systems are expected to increase performance and function. One way to increase performance and function is to increase the density of the devices and systems and pack more computing elements into the devices and systems. However, the increase in computing elements causes an increase in the EMI and RFI. EMI and RFI affect almost every electronic device, especially mobile compute devices. In addition, SoC packages are both a source of electromagnetic and radio-frequency radiation and are susceptible to EMI/RFI from adjacent sources.

Die and package radiation have been identified as RFI risk factors. In addition, radio frequency signals from internal radios and external smartphones in proximity to personal computers have interfered with the SoCs and caused basic functionality issues, including display flickering and system hang/reboot. Some SoC designs introduce disaggregation and multichip package (MCP) using an embedded multi-die interconnect bridge (EMIB) which can increase both RFI and immunity risk. Also, scalable package-level shielding techniques (simultaneously shielding both the package and the dies) are required for some Internet of Things (IoT) devices, data centers, SoCs, and seven (7)/ten (10) nm disaggregated systems.

In some systems, the package layer-count increases to provide a package surface shielding with a ground layer at the expense of package cost and system Z height. However, the package surface shielding can be insufficient because of multiple-die radiation. In addition, package surface shielding with an additional ground layer reduces radio frequency noise radiation/coupling but at the expense of package cost and Z height increases. In other systems, a conductive coating may be used. However, a conductive coating, such as metal sputtering, is considered to be prohibitively-expensive and is an uncertified manufacturing process for SoC applications and high-volume manufacturing.

In some systems, an on-board shield may be used to implement a Faraday cage with a motherboard and PCB ground contacts. While on-board shielding is relatively common, it requires good ground stitching between the Faraday cage and motherboard and PCB ground contacts. In general, about 2.5 to about five (5) mm ground stitching space (about $\lambda/20$ to about $\lambda/10$) is required to provide good shielding effectiveness up to about five (5) to about six (6) GHz WiFi channels. This requirement is almost impossible to meet for Type-3 PCBs and for compact size shielding solutions, especially for SoCs with high-density interconnects. Increasing the size of shielding for its placement around less dense PCB areas can cause mechanical warp, height increase, and thermal contact issues. The shielding effectiveness significantly relies on PCB designs and technologies (e.g., Type-3 PCB vs. Type-4 PCB) and the on-board shielding solutions are applicable only for Type-4 PCBs, which are higher in cost than Type-3 and are used only for a small number of premium PCs. High volume PCs are designed with Type-3 PCBs.

Some current radiation shield designs are often unable to resolve the effectiveness of shielding and meet the cost target. For example, in some current radiation shields, there can be a relatively high cost associated with the process to tightly hold and secure the radiation shield to the PCB. To reduce the cost, sometimes a thin shield frame design is used but EMI/RF leakage can occur due to thin shield frame designs.

In addition, a relatively high cost is typically associated with some two-piece metal radiation shields (lid and frame) and surface mount technology issues can arise due to frame warpage. Also, some radiation shields with a lid and clip design have a reduced shied effectiveness due to the seam or gap in between the clips where the radiation shield does not make contact with the PCB. In addition, with some lid and clip designs, damage to the radiation shield can cause high downtime for repairing due to the many clips causing low serviceability, especially if one or more of the clips needs to be replaced.

With a growing trend of thin and light devices, there is an industry driven need to have a compact core area of the motherboard (SOC area) that allows for flexibility in placing and routing components. One of the main tradeoffs that is seen during routing and component placement in the core area is the conflicting requirements of the location of the drill holes in the mother board. Typically, the workaround solution with the constraint of the holes in the mother board is either to increase in trace lengths of high-speed signals or place components in areas that are not intended for component placement.

In addition, the requirement of increased performance in thin systems creates challenges on designing thermal solutions that can occupy a relatively small footprint on the support structure and still produce the necessary load to achieve a thin and uniform layer of TIM and uniform pressure on the heat source to allow for desired thermal performance. Insufficient pressure or loading on the heat source limits the choice of TIM that may be used in the system. TIMs used for low load applications generally have higher thermal resistance compared to TIMs used for higher loads. The TIMs for low load applications can cause a reduction in device performance and delays in data throughput.

One current way thermal performance targets are typically achieved is by decreasing the thermal resistance between the heat source and the cold plate. The thermal resistance between the heat source and the cold plate is typically decreased by either increasing the load on the heat source from the cold plate or by changing to a different TIM that exhibits reduced thermal resistance for the same pressure, which may be nearing a point of diminishing returns for state-of-the-art grease TIMs, and/or can be cost-prohibitive for high volume manufacture for fundamentally new classes of TIMs (e.g., liquid metal). In addition, to achieve thermal performance targets, some other currently used systems increase the thermal capacitance of the system in the vicinity of the heat source. The increase in the thermal capacitance of the system in the vicinity of the heat source is typically achieved by increasing the thickness of the cold plate or heat spreader. However, this can have a direct impact on the overall system thickness and Z-height. The term "Z height," "Z location," etc. refers to the height along the "Z" axis of an (x, y, z) coordinate axis or cartesian coordinate system.

Most typical thermal solution designs involve using a heat pipe and copper spreader in combination with attachment springs to try and obtain a desired loading. The attachment springs are usually are made of steel which deflect a defined distance to provide the desired load on the heat source and help to create a uniform thickness of TIM. The heat pipe, copper spreader, and attachment spring are usually stacked in layers.

Some common typical thermal solutions (cold plate and heat pipe) are attached by a four-point attachment system that includes four leaf springs and four screws to create a desired amount of pressure on the cold plate and on the TIM and the heat source. Typically, the leaf springs extend relatively far away from the cold plate to generate a bending moment to create the desired pressure on the cold plate, TIM, and heat source. In addition, the leaf springs are attached to the PCB using four through holes in the PCB and the four through holes prevent trace routing around the through hole area. The four-leaf springs and screws create keep out zones on the PCB and limit where other components of the electronic device can be located on the PCB and the leaf springs and four screws take up valuable space on the PCB. In addition, there can be a relatively higher costs due to the high number of attachment points.

Some systems use a three-point attachment system, because the reduction of one through hole will decrease the keep out zone size and allow for relatively easier routing in PCB layers because in a three-point attachment system, one through hole is removed as compared to the four-point attachment system that requires four through holes in the PCB. However, the three-point attachment system typically does not produce a smooth pressure or an even distribution of the pressure from the cold plate as compared to the four-point attachment system. Also, in a three-point attachment system, the leaf arm is longer on one side and that can cause cold plate bending. Further, with a three-point attachment system, the cold plate is not typically saddled properly on the TIM and heat source and does not create a desired uniform pressure on the TIM and heat source. In addition, the screw locations for most three-point attachment systems are relatively far away from the cold plate and this can generate a bending moment that deflects the cold plate and decreases the thermal performance of the cold plate. To further reduce the amount of through holes in the PCB, some systems use a two-point attachment. However, as with the three-point attachment system, with some current two-point attachment systems, the cold plate can easily tilt and put pressure on one side of the TIM and heat source and almost none on the other side of the TIM and heat source.

There is also a strong need in "always connected" (4G/5G radio adoption) thin and light devices and bezel less laptops to place the antenna in the base. The antenna in the base leads to more challenges/complexity in RFI mitigation as the noise sources such as CPU, GPU, memory etc. are placed very close to the antenna. In such scenarios, shielding becomes a critical requirement to prevent RFI. Platform on-board shield can reduce platform noise radiation for interfaces such as memory subsystem however, poor ground contact design and electrical openings in the on-board shield can reduce the shielding effectiveness. What is needed is a radiation shield that can be coupled to a substrate without creating through holes in the PCB. In addition, it would be beneficial if the radiation shield also functioned as a cold plate attachment that can provide an even distribution of force on the TIM and heat source without creating through holes in the PCB.

A vacuum-based attachment for a heat sink and a radiation shield, as outlined in FIGS. 1A-1C, can resolve these issues (and others). In an example, a radiation shield (e.g., the radiation shield 110) can include a lid (e.g., the lid 112), a vacuum bag (e.g., the vacuum bag 114), and radiation shield wall (e.g., the radiation shield wall 116). The radiation shield can be over the one or more radiation sources. The one or more radiation sources can be a heat source (e.g., a processor or some other heat source that also generates radiation, particularly electromagnetic radiation and/or radio-frequency radiation). The lid can be a heat sink and more particularly a vapor chamber or cold plate. As used herein, the term "heat sink" includes a component or components that help to move heat away from the one or more radiation sources.

When collapsed and deformed due to a vacuum being created in the vacuum bag, the vacuum bag can help provide a vacuum-based mechanical load that helps to create an applied load on the one or more radiation sources by the lid. The lid, the vacuum tube, and the radiation shield wall together create the radiation shield and can help provide an integrated EMI shielding mechanism along with a loading action on the heat source without creating holes on support structure.

The vacuum bag can be created using a thin metal foil encapsulating an elastomeric material. The elastomeric material can help to provide structure to the vacuum bag and help to prevent the vacuum bag from collapsing. The vacuum bag is secured to the lid using solder, adhesive, tape, a weld, or some other type of fastener or coupling means, or some other means of attaching the lid to the vacuum bag. In a specific example, the elastic collapsible portion (e.g., vacuum tube 128 described below) of the vacuum bag can be soldered to the lid. The vacuum bag (and lid attached to the vacuum bag) is coupled to the radiation shield wall using a mechanical fastener, magnets, solder, adhesive, tape, a weld, or some other type of fastener or coupling means that can secure the vacuum bag to the radiation shield wall. In a specific example, the vacuum bag is secured to the radiation shield wall using a fence structure with slots that allow "hook" like structures to interlock with the fence structure. The hook like structures can be part of the vacuum bag.

The lid can have an opening that extends to an opening in the vacuum bag through which the air can be removed from the vacuum bag to create a vacuum. The created vacuum pulls the hook-fence structure together and creates a mechanical load on the heat source sufficient to squeeze the TIM to a desired bond line thickness. In some examples, the lid does not have an opening and the air is directly removed from the vacuum bag to create the vacuum.

The vacuum bag can have an internal pressure that is less than one (1) atmospheric pressure (ATM) such that a vacuum is created inside the vacuum bag. In an example, the pressure inside the vacuum bag is equal to or below about 0.9 ATM. In other examples, the pressure inside the vacuum bag is equal to or less than about 0.7 ATM. In some examples, the pressure inside the vacuum bag is between about 0.9 ATM to about 0.15 ATM and ranges therein (e.g., between about 0.4 ATM and about 0.25 ATM, or between about 0.5 ATM and about 0.3 ATM), depending on design choice and design constraints. More specifically, when the vacuum is created inside the vacuum bag, the vacuum bag will deform and collapse. Because the vacuum bag is secured to the radiation shield wall and the radiation shield wall are secured to the support structure, the deformation and collapse of the vacuum bag causes the lid, which is attached to the vacuum bag, to move in the direction of the TIM and the radiation source and create an applied load on the TIM 14 and the radiation source. The greater the size of the vacuum bag and/or the greater the vacuum created in the vacuum bag, the greater the applied load on the TIM and the radiation source.

In an example, the vacuum tube does not extend the entire length around the radiation shield wall and there is a gap to allow an environment inside the radiation shield to have the same pressure as an environment outside of the radiation shield. The gap allows for pressure equalization to help ensure the environment inside the radiation shield is atmospheric or about the same as the environment outside of the radiation shield. The vacuum tube can be hermetically sealed to help prevent the penetration of liquid vapor into the vacuum tube.

In an example, the lid and the radiation shield wall can be comprised of a conducive material and can include stainless steel, copper, an alloy such as nickel copper, or some material that is conductive, rigid, and can help contain or mitigate the radiation from the one or more radiation sources from extending past the radiation shield or at least partially contain or mitigate the radiation from the one or more radiation sources from extending past the radiation shield. The lid and the radiation shield wall may be comprised of the same material or the lid may be comprised of a different material than the radiation shield wall. The vacuum bag can be comprised of metals (SS and alloys) of sufficient thickness (e.g., about 0.2 mm) have low permeability to moisture and can maintain structural integrity for extended periods of time without degradation.

The radiation shield with a vacuum-based attachment can allow for a more compact core area on the support structure as there are no holes required in the support structure. Because there are no holes in the support structure, space on the support structure can be saved and the routing of trace lines on the support structure can be easier than if the support structure included through holes. In addition, because the vacuum bag creates an applied load, the radiation shield with a vacuum-based attachment can reduce cost as compared to some current EMI shields with leaf spring as a separate leaf spring/compression spring and backplate structural parts are not required, or the back plate (if needed for the package reliability) can be integrated to the board without screws. The seamless (no gap) connection between the radiation shield and the support structure helps to provide a shield against the effects of electromagnetic waves. More specifically, the radiation shield can provide attenuations of 80 dB for a lower frequency of 2.45 GHz and at least 30 dB attenuation for a higher frequency of 6.5 GHz.

Figure 2A:
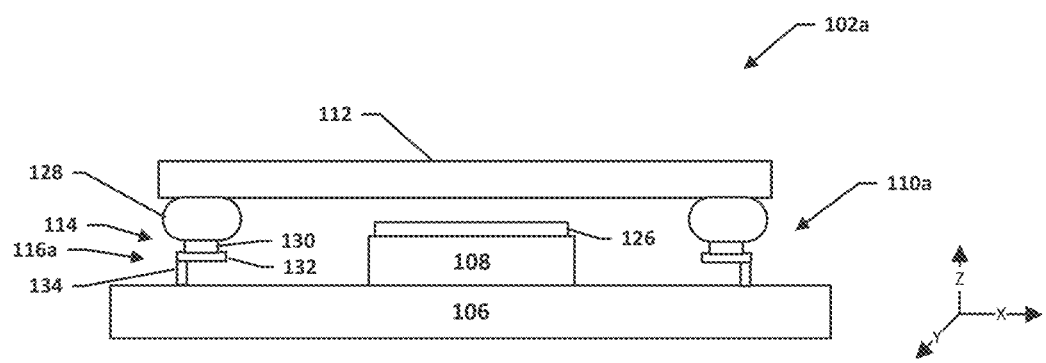
FIGS. 2A and 2B are simplified block diagrams of a portion of a system to enable a vacuum-based attachment for a heat sink and a radiation shield, in accordance with an embodiment of the present disclosure.
Figure 2B:
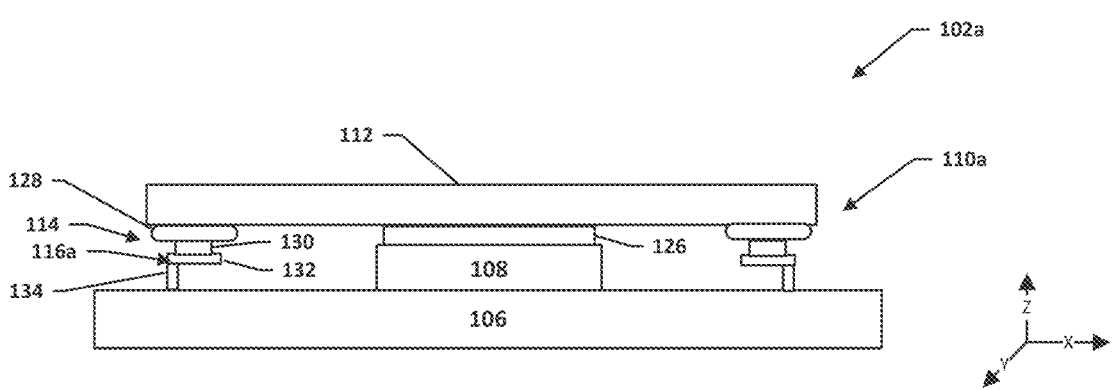

Turning to FIGS. 2A and 2B, FIGS. 2A and 2B are a simplified block diagram of a side cut away view of a portion of an electronic device 102a, in accordance with an embodiment of the present disclosure. FIG. 2A illustrates an example of the vacuum bag 114 before a vacuum is created inside the vacuum bag 114 and FIG. 2B illustrates an example of the vacuum bag 114 after a vacuum is created inside the vacuum bag 114. In an example, the electronic device 102a can include the support structure 106, the radiation source 108, a radiation shield 110a, and TIM 126. In some examples, the support structure 106 can be a PCB.

The radiation shield 110a can include the lid 112, the vacuum bag 114, and radiation shield wall 116a. The vacuum bag 114 can include a vacuum tube 128 and a vacuum bag support 130. The radiation shield wall 116a can include a vacuum bag attachment surface 132 and a radiation shield wall support structure 134.

The TIM 126 is between the radiation source 108 and the lid 112 and provides a thermal interface to help transfer heat from the radiation source 108 to the lid 112. The vacuum tube 128 can be a collapsible structure where a vacuum can be created. The vacuum bag support 130 provides structure to the vacuum bag 114 to allow the vacuum bag 114 to have a controlled shape when the vacuum is created in the vacuum bag 114 and help to prevent the vacuum bag 114 from deforming when the vacuum is created in the vacuum bag 114. The vacuum bag attachment surface 132 provides an attachment point on the radiation shield wall 116a to allow the vacuum bag 114 to be attached and secured to the radiation shield wall 116a. The radiation shield wall support structure 134 provides support for the radiation shield wall 116a.

As illustrated in FIG. 2A, before a vacuum is created inside the vacuum bag 114, the lid 112 is above the TIM 126 and radiation source 108 and is not applying any load on the TIM 126 and radiation source 108. As illustrated in FIG. 2B, when a vacuum is created inside the vacuum bag 114, the vacuum tube 128 deforms and collapses. Because the vacuum bag 114 is secured to the radiation shield wall 116a and the radiation shield wall 116a are secured to the support structure 106, the deformation and collapse of the vacuum tube 128 causes the lid 112, which is attached to the vacuum bag 114, to move in the direction of the TIM 126 and the radiation source 108 and create an applied load on the TIM 126 and the radiation source 108. The greater the size of the vacuum bag 114 and/or the greater the vacuum created in the vacuum bag 114, the greater the applied load on the TIM 126 and the radiation source 108. While FIGS. 2A and 2B are showing a specific profile for the vacuum bag 114, other profiles may be used depending on design constraints and design choice. For example, the vacuum bag 114 may have a more rounded profile, a triangular profile, or some other profile, depending on design constraints and design choice. In addition, the radiation shield wall support structure 134 can be any size and/or shape that will provide support for the radiation shield wall 116, depending on design constrains and design choice. Also, the vacuum bag attachment surface 132 can be any size and/or shape that will allow the vacuum bag 114 to be coupled to the radiation shield wall 116 using a mechanical fastener, magnets, solder, adhesive, tape, a weld, or some other type of fastener or coupling means that can secure the vacuum bag 114 to the radiation shield wall 116, depending on design constrains and design choice.

Figure 3:
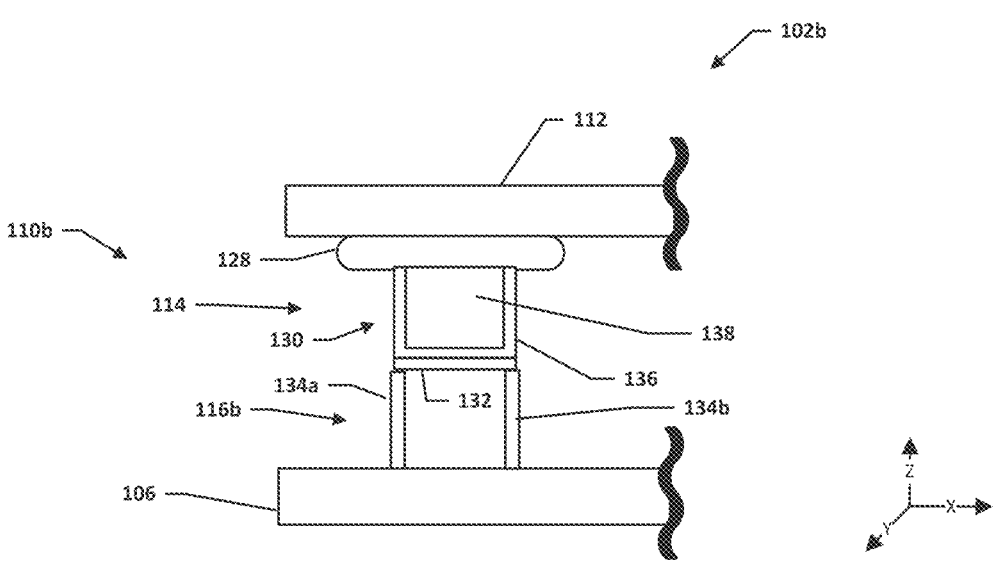
FIG. 3 is a simplified block diagram of a portion of a system to enable a vacuum-based attachment for a heat sink and a radiation shield, in accordance with an embodiment of the present disclosure.

Turning to FIG. 3, FIG. 3 is a simplified block diagram of a side cut away view of a portion of an electronic device 102b, in accordance with an embodiment of the present disclosure. In an example, the electronic device 102b can include the support structure 106 and a radiation shield 110b. In some examples, the support structure 106 can be a PCB. The radiation shield 110b can include the lid 112, the vacuum bag 114, and radiation shield wall 116b. The vacuum bag 114 can include the vacuum tube 128 and the vacuum bag support 130. The vacuum bag support 130 can include a vacuum bag support structure 136 and support material 138. The radiation shield wall 116b can include the vacuum bag attachment surface 132 and radiation shield wall support structures 134a and 134b.

The vacuum tube 128 can be a collapsible structure where a vacuum can be created. The vacuum bag support 130 provides structure to the vacuum bag 114 to allow the vacuum bag 114 to have a controlled shape when the vacuum is created in the vacuum bag 114 and help to prevent the vacuum bag 114 from deforming when the vacuum is created in the vacuum bag 114. More specifically, the vacuum bag support structure 136 helps to contain the support material 138. The support material 138 can be an elastic material that can flex and help absorb some of the forces when the vacuum is created in the vacuum bag 114. More specifically, the support material 138 may be a foam, an elastomer, rubber (e.g., a class M-rubber such as EPDM, silicone rubber, or some other synthetic or natural rubber), or some other material or filling that can help absorb some of the forces when the vacuum is created in the vacuum bag 114. The vacuum bag attachment surface 132 provides an attachment point on the radiation shield wall 116a to allow the vacuum bag 114 to be attached and secured to the radiation shield wall 116a. The radiation shield wall support structures 134a and 134b provide support for the radiation shield wall 116a.

Figure 4:
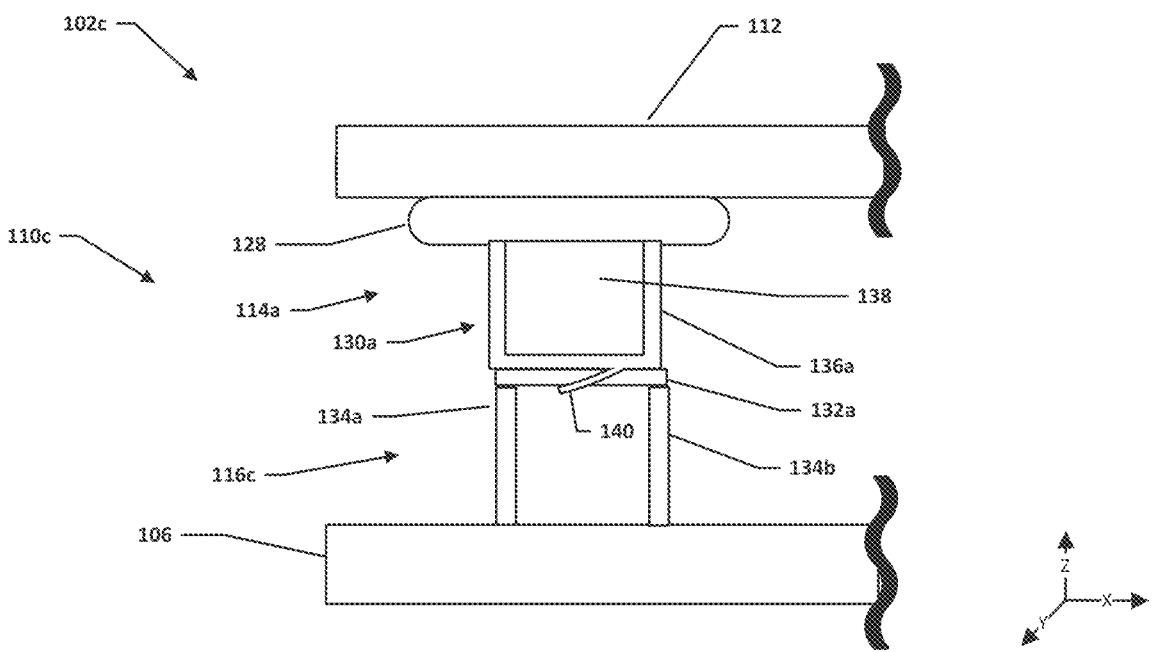
FIG. 4 is a simplified block diagram of a portion of a system to enable a vacuum-based attachment for a heat sink and a radiation shield, in accordance with an embodiment of the present disclosure.

Turning to FIG. 4, FIG. 4 is a simplified block diagram of a side cut away view of a portion of an electronic device 102c, in accordance with an embodiment of the present disclosure. In an example, the electronic device 102c can include the support structure 106 and a radiation shield 110c. In some examples, the support structure 106 can be a PCB. The radiation shield 110c can include, a vacuum bag 114a, and radiation shield wall 116c. The vacuum bag 114a can include the vacuum tube 128, the vacuum bag support 130, and securing hook 140. The vacuum bag support 130a can include the vacuum bag support structure 136 and the support material 138. The radiation shield wall 116c can include a vacuum bag attachment surface 132a and the radiation shield wall support structures 134a and 134b.

The vacuum tube 128 can be a collapsible structure where a vacuum can be created. The vacuum bag support 130a provides structure to the vacuum bag 114a to allow the vacuum bag 114a to have a controlled shape when the vacuum is created in the vacuum bag 114a and help to prevent the vacuum bag 114a from deforming when the vacuum is created in the vacuum bag 114a. More specifically, the vacuum bag support structure 136a helps to contain the support material 138, and provide some structure for the vacuum bag 114a. The vacuum bag support structure 136a can include the securing hook 140 or is secured to the securing hook 140.

The vacuum bag attachment surface 132a provides an attachment point on the radiation shield wall 116c to allow the vacuum bag 114a to be attached and secured to the radiation shield wall 116c. More specifically, the securing hook 140 can coupled to the vacuum bag attachment surface 132a to help secure the vacuum bag 114a to the radiation shield wall 116c. The radiation shield wall support structures 134a and 134b provide support for the radiation shield wall 116c.

Figure 5A:
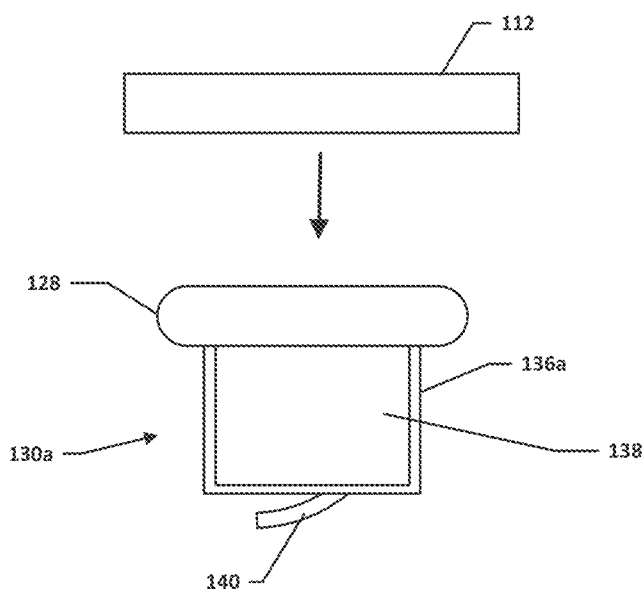
FIGS. 5A-5D are simplified block diagrams of a portion of a system to enable a vacuum-based attachment for a heat sink and a radiation shield, in accordance with an embodiment of the present disclosure.

Turning to FIG. 5A, FIG. 5A is a simplified block diagram of a side cut away view of a portion of the vacuum bag 114a, in accordance with an embodiment of the present disclosure. In an example, the vacuum bag 114a can include the vacuum tube 128, the vacuum bag support 130a, and the securing hook 140. The vacuum bag support 130a can include the vacuum bag support structure 136a and the support material 138. In an example, the lid 112 can be attached to the vacuum bag 114a.

The vacuum tube 128 can be a collapsible structure where a vacuum can be created. The vacuum bag support 130a provides structure to the vacuum bag 114a to allow the vacuum bag 114a to have a controlled shape when the vacuum is created in the vacuum bag 114a and help to prevent the vacuum bag 114a from deforming when the vacuum is created in the vacuum bag 114a. More specifically, the vacuum bag support structure 136a helps to contain the support material 138. The support material 138 can be an elastic material that can flex and help absorb some of the forces when the vacuum is created in the vacuum bag 114a. As shown in FIGS. 5C and 5D, the securing hook 140 can coupled to the vacuum bag attachment surface 132a of the radiation shield wall 116c to help secure the vacuum bag 114a to the radiation shield wall 116c.

Figure 5B:
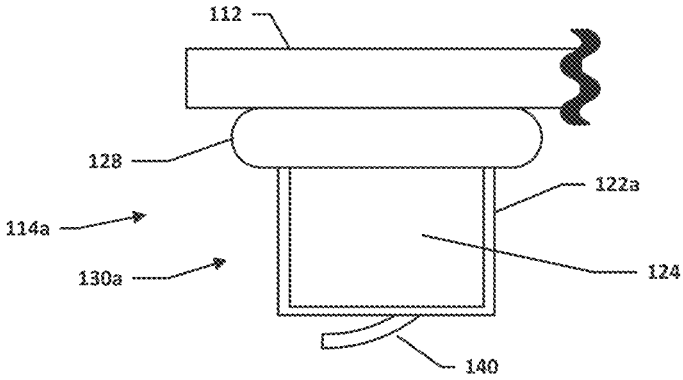
Figure 5C:
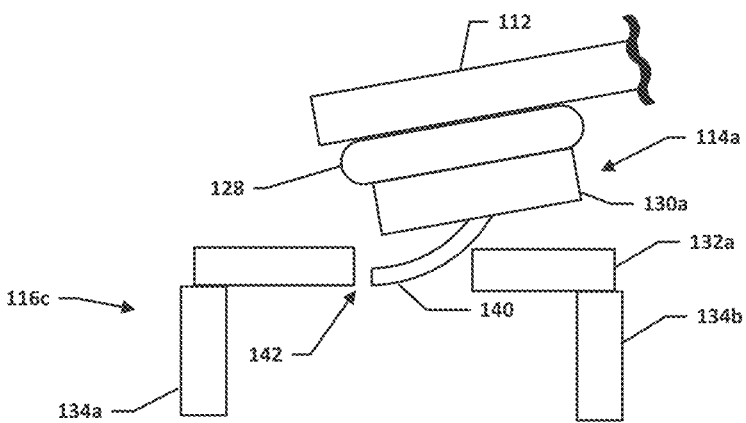
Figure 5D:
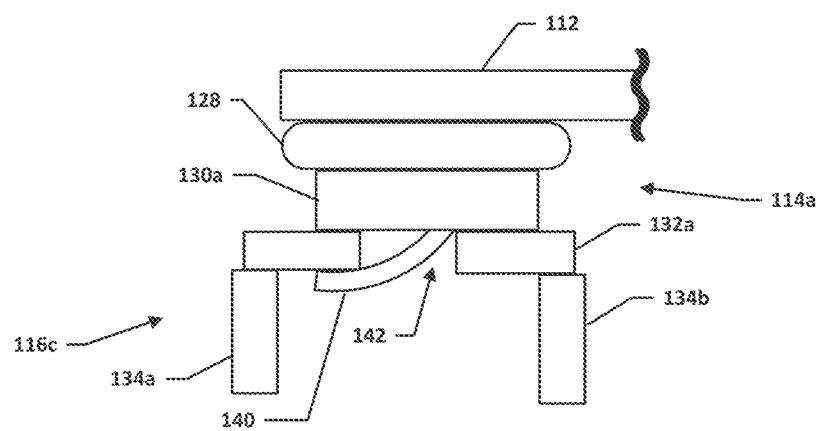

Turning to FIG. 5B, FIG. 5B is a simplified block diagram of a side cut away view of a portion of the vacuum bag 114a and lid 112, in accordance with an embodiment of the present disclosure. In an example, the vacuum bag 114a can include the vacuum tube 128, the vacuum bag support 130a, and the securing hook 140. The vacuum bag support 130a can include the vacuum bag support structure 136a and the support material 138.

As illustrated in FIG. 5B, the lid 112 can be attached to the vacuum bag 114a. The lid 112 can be a heat sink and more particularly a vapor chamber, cold plate, or component or components that help to move heat away from the one or more heat sources (e.g., the radiation sources 108). The lid 112 can be attached to the vacuum bag 114a using solder, adhesive, tape, a weld, or some other type of fastener or coupling means that, or some other means of attaching the lid 112 to the vacuum bag 114a.

Turning to FIG. 5C, FIG. 5C is a simplified block diagram of a side cut away view of a portion of the vacuum bag 114a and lid 112 being coupled to the radiation shield wall 116c, in accordance with an embodiment of the present disclosure. In an example, the vacuum bag 114a can include the vacuum tube 128, the vacuum bag support 130a, and the securing hook 140. The lid 112 can be attached to the vacuum bag 114a.

The radiation shield wall 116c can include the vacuum bag attachment surface 132a and radiation shield wall support structures 134a and 134b. The vacuum bag attachment surface 132a can include the securing hook receptacle 142. The vacuum bag attachment surface 132a provides an attachment point on the radiation shield wall 116c to allow the vacuum bag 114a to be attached and secured to the radiation shield wall 116c. More specifically, the vacuum bag 114a can be angled so the securing hook 140 can slide into the securing hook receptacle 142 to help secure the vacuum bag 114a to the radiation shield wall 116c. The radiation shield wall support structures 134a and 134b provide support for the radiation shield wall 116c.

Turning to FIG. 5D, FIG. 5D is a simplified block diagram of a side cut away view of a portion of the vacuum bag 114a and lid 112 coupled to the radiation shield wall 116c, in accordance with an embodiment of the present disclosure. In an example, the vacuum bag 114a can include the vacuum tube 128, the vacuum bag support 130a, and the securing hook 140. The lid 112 can be attached to the vacuum bag 114a.

The radiation shield wall 116c can include the vacuum bag attachment surface 132a and radiation shield wall support structures 134a and 134b. The vacuum bag attachment surface 132a can include a securing hook receptacle 142. The vacuum bag attachment surface 132a provides an attachment point on the radiation shield wall 116c to allow the vacuum bag 114a to be attached and secured to the radiation shield wall 116c. More specifically, the securing hook 140 can coupled to the vacuum bag attachment surface 132a using the securing hook receptacle 142 to help secure the vacuum bag 114a to the radiation shield wall 116c. The radiation shield wall support structures 134a and 134b provide support for the radiation shield wall 116c.

When the vacuum is created in the vacuum bag 114a, the vacuum bag 114a deforms and collapses. Because the vacuum bag 114a is secured to the radiation shield wall 116a by the securing hook 140 and the radiation shield wall 116a are secured to the support structure 106 (not shown), the deformation and collapse of the vacuum tube 128 causes the lid 112, which is attached to the vacuum bag 114a, to move in the direction of the TIM 126 and the radiation source 108 and create an applied load on the TIM 126 and the radiation source 108. The greater the size of the vacuum bag 114a and/or the greater the vacuum created in the vacuum bag 114a, the greater the applied load on the TIM 126 and the radiation source 108. While FIGS. 5A-5C are showing a specific profile for the vacuum bag 114, other profiles may be used depending on design constraints and design choice. For example, the vacuum bag 114 may have a more rounded profile, a triangular profile, or some other profile, depending on design constraints and design choice.

Figure 6A:
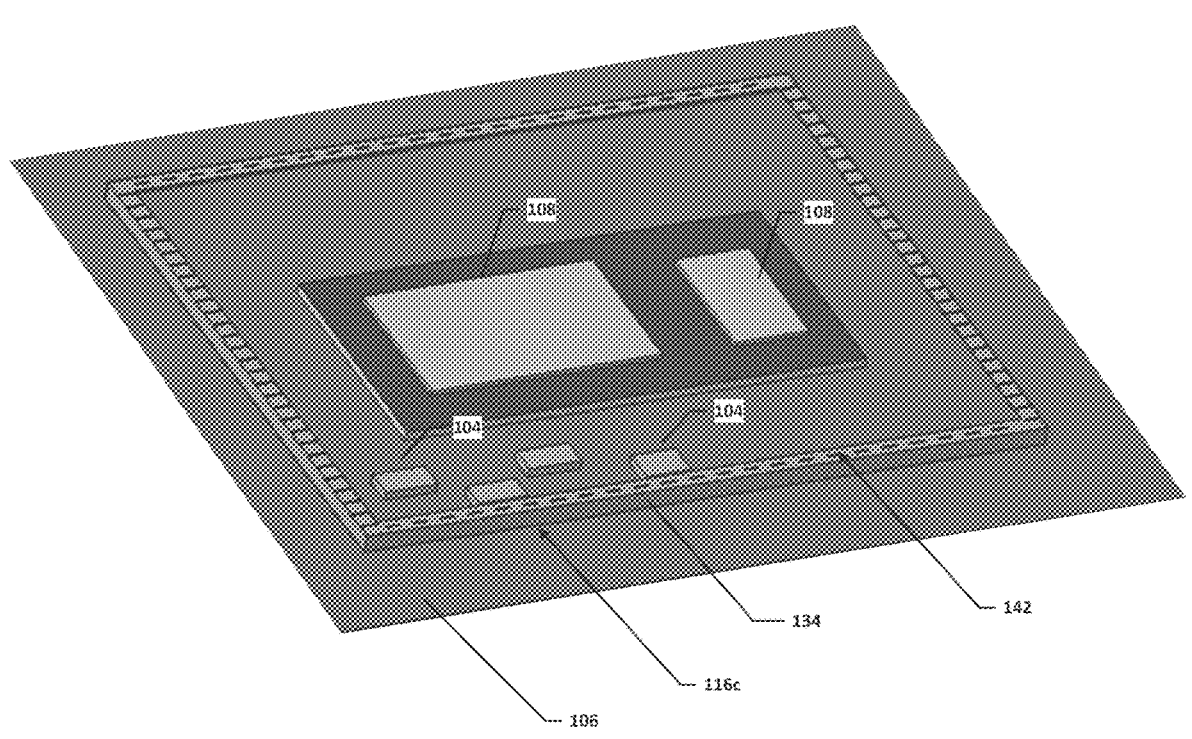
FIGS. 6A-6C are simplified perspective views of a portion of a system to enable a vacuum-based attachment for a heat sink and a radiation shield, in accordance with an embodiment of the present disclosure.

Turning to FIG. 6A, FIG. 6A is a simplified block diagram of the support structure 106 configured with a portion of the radiation shield with the vacuum-based attachment, in accordance with an embodiment of the present disclosure. In an example, the support structure 106 can include the least one of the one or more electronics 104, the one or more radiation sources 108, and the radiation shield wall 116c. The radiation shield wall 116c can include the vacuum bag attachment surface 132a and the radiation shield wall support structure 134a. The vacuum bag attachment surface 132a can include the securing hook receptacle 142.

Figure 6B:
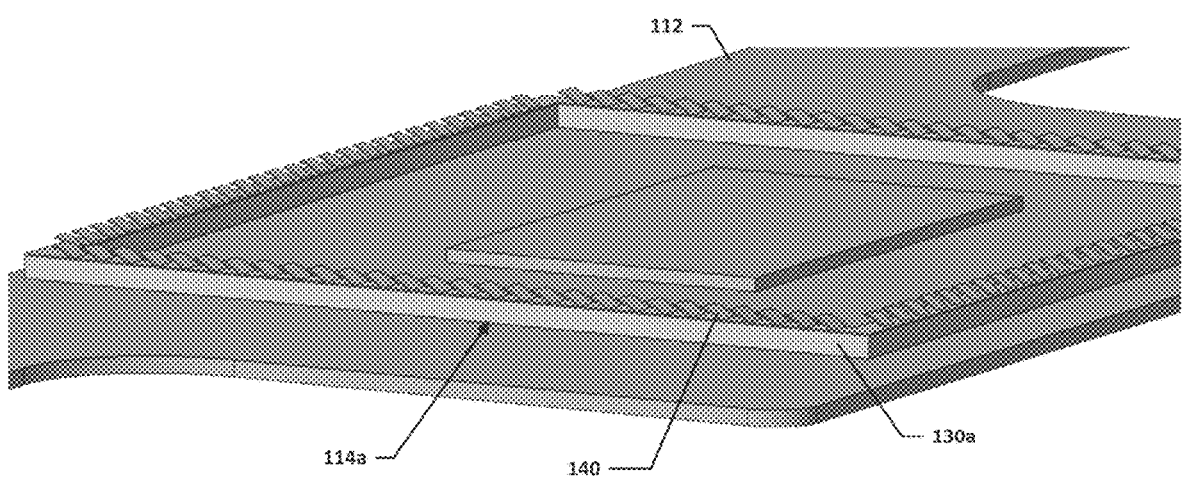

Turning to FIG. 6B, FIG. 6B is a simplified block diagram of the lid 112 attached to the vacuum bag 114a. The lid 112 can be attached to the vacuum bag 114a using solder, adhesive, tape, a weld, or some other type of fastener or coupling means that can attach the lid 112 to the vacuum bag 114a. The vacuum bag 114a can include the vacuum tube 128 (not shown), the vacuum bag support 130a, and the securing hooks 140.

Figure 6C:
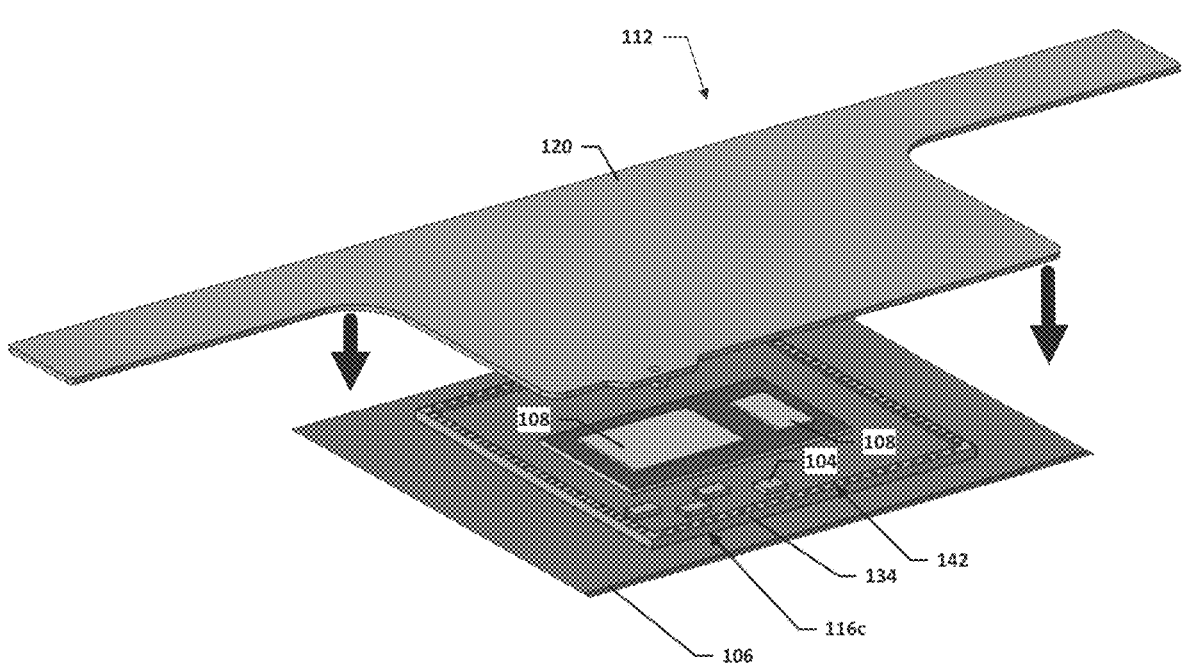

Turning to FIG. 6C, FIG. 6C is a simplified block diagram of the lid 112 being attached to the radiation shield wall 116c on the support structure 106. In an example, the support structure 106 can include the least one of the one or more electronics 104, the one or more radiation sources 108, and the radiation shield wall 116c. The radiation shield wall 116c can include can include the vacuum bag attachment surface 132a and the radiation shield wall support structure 134a. The vacuum bag attachment surface 132a can include the securing hook receptacle 142. The lid 112 can include the vacuum bag 114a (not shown).

The vacuum bag attachment surface 132a provides an attachment point on the radiation shield wall 116c to allow the lid 112 and the vacuum bag 114a to be attached and secured to the radiation shield wall 116c. More specifically, the lid 112 and the vacuum bag 114a can positioned onto the radiation shield wall 116c so the securing hook 140 can slide into the securing hook receptacle 142 to help secure the lid 112 and the vacuum bag 114a to the radiation shield wall 116c. After the lid 112 and the vacuum bag 114a have been secured to the radiation shield wall 116c, air is pumped out of the vacuum bag 114a to create the radiation shield 110. The vacuum created in the vacuum bag 114a helps to create a suction force to create an applied load on the radiation source 108 by the lid 112. If the lid 112 is a heat sink, the vacuum bag 114a can help provide a vacuum-based mechanical loading approach that helps to create an applied load on the one or more radiation sources 108 by the lid 112. The lid 112, the vacuum bag 114a, and the radiation shield wall 116c together create the radiation shield 110 and can help provide an integrated shielding mechanism along with a loading action on a heat source without creating holes on support structure 106.

Figure 7:
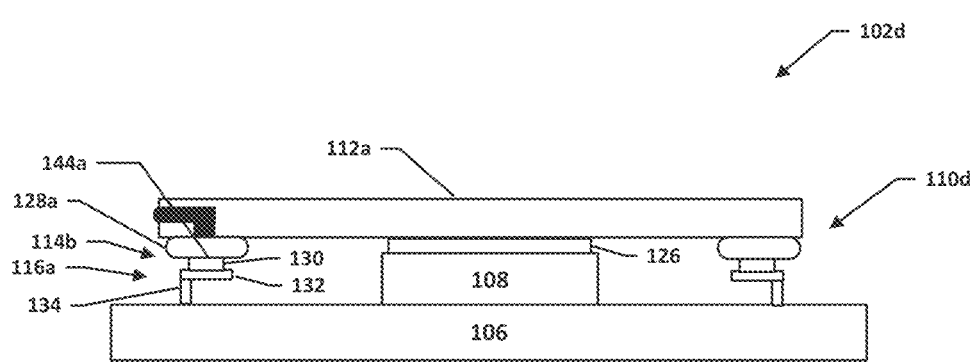
FIG. 7 is a simplified block diagram of a portion of a system to enable a vacuum-based attachment for a heat sink and a radiation shield, in accordance with an embodiment of the present disclosure.

Turning to FIG. 7, FIG. 7 is a simplified block diagram of a side cut away view of a portion of an electronic device 102d, in accordance with an embodiment of the present disclosure. In an example, the electronic device 102d can include the support structure 106, the radiation source 108, a radiation shield 110d, and the TIM 126. In some examples, the support structure 106 can be a PCB. The radiation shield 110d can include the lid 112a, the vacuum bag 114b, and radiation shield wall 116a. The vacuum bag 114b can include a vacuum tube 128a and the vacuum bag support 130. The lid 112a can include a vacuum valve 144a that extends to the vacuum bag 114b. The radiation shield wall 116a can include the vacuum bag attachment surface 132 and the radiation shield wall support structure 134.

The TIM 126 is between the radiation source 108 and the lid 112 and provides a thermal interface to help transfer heat from the radiation source 108 to the lid 112. The vacuum tube 128 can be a collapsible structure where a vacuum can be created using the vacuum valve 144a. The vacuum bag support 130 provides structure to the vacuum bag 114b to allow the vacuum bag 114b to have a controlled shape when the vacuum is created in the vacuum bag 114b and help to prevent the vacuum bag 114b from deforming when the vacuum is created in the vacuum bag 114b using the vacuum valve 144a. The vacuum bag attachment surface 132 provides an attachment point on the radiation shield wall 116a to allow the vacuum bag 114b to be attached and secured to the radiation shield wall 116a. The radiation shield wall support structure 134 provides support for the radiation shield wall 116a.

After the lid 112 and the vacuum bag 114b have been secured to the radiation shield wall 116a, air is pumped out of the vacuum bag 114b using the vacuum valve 144a to create a vacuum in the vacuum bag 114b. The vacuum created in the vacuum bag 114b helps to create a suction force to create an applied load on the TIM 126 and the radiation source 108 by the lid 112a. If the lid 112a is a heat sink, the vacuum bag 114b can help provide a vacuum-based mechanical loading approach that helps to create an applied load on the one or more radiation sources 108 by the lid 112. The lid 112, the vacuum bag 114b, and the radiation shield wall 116a together create the radiation shield 110d and can help provide an integrated shielding mechanism along with a loading action on a heat source without creating holes on support structure 106.

Figure 8:
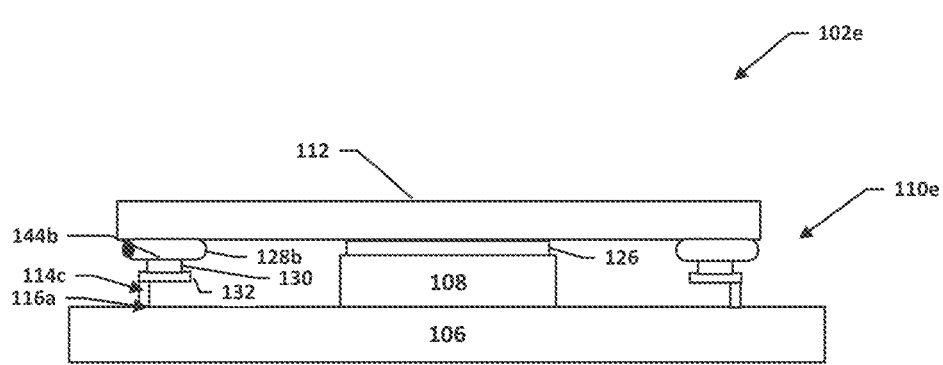
FIG. 8 is a simplified block diagram of a portion of a system to enable a vacuum-based attachment for a heat sink and a radiation shield, in accordance with an embodiment of the present disclosure.

Turning to FIG. 8, FIG. 8 is a simplified block diagram of a side cut away view of a portion of an electronic device 102e, in accordance with an embodiment of the present disclosure. In an example, the electronic device 102e can include the support structure 106, the radiation source 108, a radiation shield 110e, and the TIM 126. In some examples, the support structure 106 can be a PCB. The radiation shield 110e can include the lid 112, the vacuum bag 114c, and radiation shield wall 116a. The vacuum bag 114c can include a vacuum tube 128b and the vacuum bag support 130. The vacuum tube 128b can include vacuum valve 144b.

The radiation shield wall 116a can include the vacuum bag attachment surface 132 and the radiation shield wall support structure 134.

The TIM 126 is between the radiation source 108 and the lid 112 and provides a thermal interface to help transfer heat from the radiation source 108 to the lid 112. The vacuum tube 128b can be a collapsible structure where a vacuum can be created using the vacuum valve 144b. The vacuum bag support 130 provides structure to the vacuum bag 114c to allow the vacuum bag 114c to have a controlled shape when the vacuum is created in the vacuum bag 114c and help to prevent the vacuum bag 114c from deforming when the vacuum is created in the vacuum bag 114c using the vacuum valve 144b. The vacuum bag attachment surface 132 provides an attachment point on the radiation shield wall 116a to allow the vacuum bag 114c to be attached and secured to the radiation shield wall 116a. The radiation shield wall support structure 134 provides support for the radiation shield wall 116a.

After the lid 112 and the vacuum bag 114c have been secured to the radiation shield wall 116a, air is pumped out of the vacuum bag 114c using the vacuum valve 144b to create a vacuum in the vacuum bag 114c. The vacuum created in the vacuum bag 114c helps to create an applied load on the TIM 126 and the radiation source 108 by the lid 112a. If the lid 112a is a heat sink, the vacuum bag 114c can help provide a vacuum-based mechanical loading approach that helps to create an applied load on the one or more radiation sources 108 by the lid 112. The lid 112, the vacuum bag 114c, and the radiation shield wall 116a together create the radiation shield 110e and can help provide an integrated shielding mechanism along with a loading action on a heat source without creating holes on support structure 106.

Figure 9A:
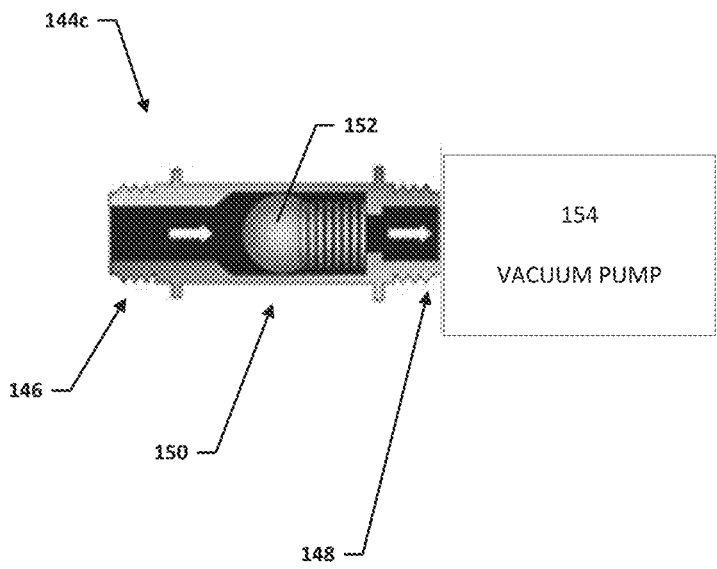
FIGS. 9A and 9B are simplified block diagrams illustrating example details of a portion of a system to enable a vacuum-based attachment for a heat sink and a radiation shield, in accordance with an embodiment of the present disclosure.

Turning to FIG. 9A, FIG. 9A is a simplified block diagram of a side cut away view of a portion of a vacuum valve 144c in an open configuration, in accordance with an embodiment of the present disclosure. The vacuum valve 144c can be similar to the vacuum valve 144a or the vacuum valve 144b. More specifically, the vacuum valve 144c may be located in lid 112 (not shown), may be located in the vacuum bag 114 (not shown), or may be located in some other location that can allow the vacuum to be created in the vacuum bag 114.

In an example, the vacuum valve 144c can include an inlet 146 and an exhaust 148. A middle portion 150 can be between the inlet 146 and the exhaust 148. The middle portion 150 can include a one-way valve 152. Note that the middle portion 150 does not need to be in the exact middle of the vacuum valve 144c and may be closer to the inlet 146 than the exhaust 148 or may be closer to the exhaust 148 than the inlet 146.

In an illustrative example, a vacuum pump 154 can be coupled to the exhaust 148 of the vacuum valve 144c. The vacuum pump 154 can remove the air from the vacuum bag 114 and create a vacuum in the vacuum bag 114. The created vacuum in the vacuum bag 114 causes the vacuum tube 128 to collapse. The collapse of the vacuum tube 128 helps to create an applied load on the one or more radiation sources 108 by the lid 112.

Figure 9B:
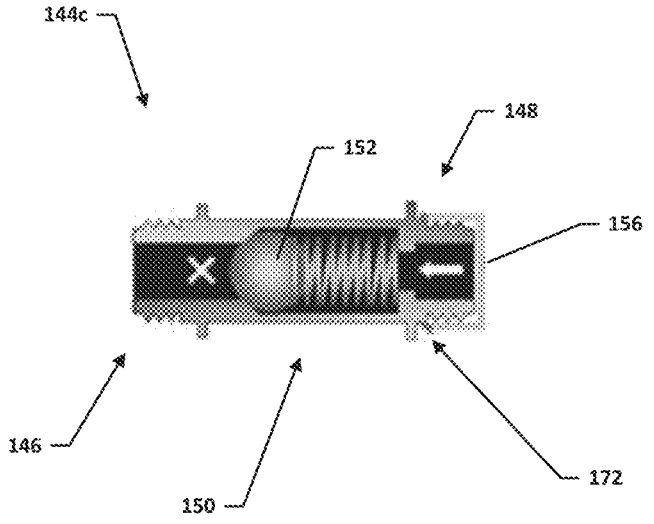

Turning to FIG. 9B, FIG. 9B is a simplified block diagram of a side cut away view of a portion of the vacuum valve 144c in a closed configuration, in accordance with an embodiment of the present disclosure. The vacuum valve 144c can include the inlet 146, the exhaust 148, and the middle portion 150. The middle portion 150 can include the one-way valve 152. After the vacuum has been created in the vacuum bag, the vacuum pump 154 (illustrated in FIG. 9A) is removed. The exhaust 148 can be sealed with a cap 156 to help keep and sustain the vacuum in the vacuum bag 114 and prevent air from returning to the vacuum bag 114. In some examples, the cap 156 is a metal foil cap. The cap 156 can be further sealed to the exhaust 148 using a sealant 172 to help prevent air from returning into the vacuum bag 114. The sealant 172 can be solder or some other type of sealant that can help keep and sustain the vacuum in the vacuum bag 114. The one-way valve 152 also helps to keep and sustain the vacuum in the vacuum bag 114 by helping to prevent air from returning into the vacuum bag 114.

Figure 10A:
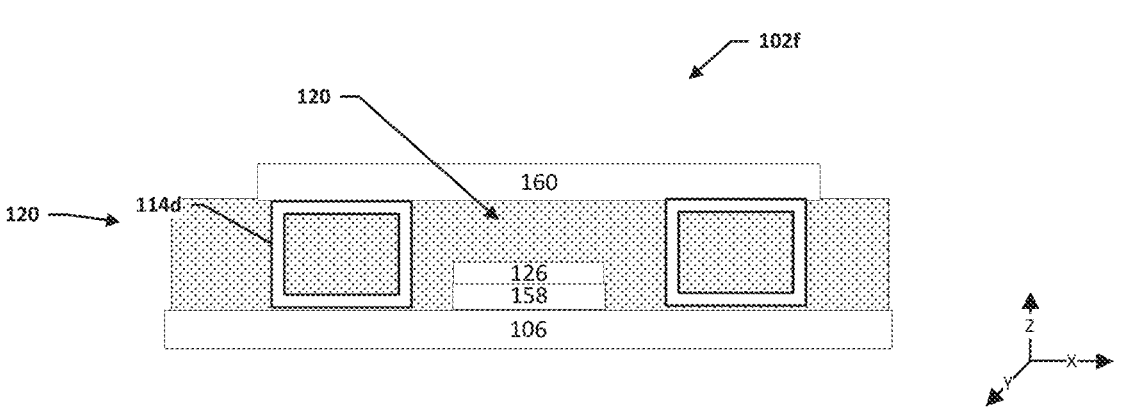
FIGS. 10A-10B are simplified block diagrams illustrating example details of a vacuum-based attachment for a cold plate, in accordance with an embodiment of the present disclosure.
Figure 10B:
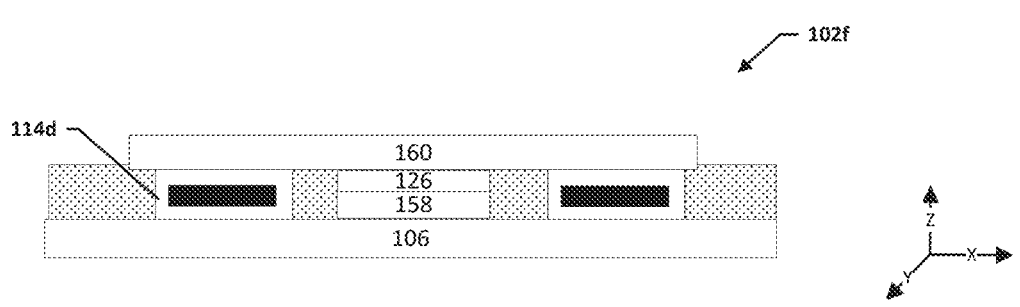

Turning to FIGS. 10A and 10B, FIGS. 10A and 10B are simplified block diagrams of an electronic device 102f configured with a vacuum-based heat spreader attachment, in accordance with an embodiment of the present disclosure. In an example, the electronic device 102e can the support structure 106. The support structure 106 can include one or more heat sources 158. The TIM 126 can be between the one or more heat sources 158 and a heat sink 160.

The heat sink 160 can be a heat sink, a vapor chamber or cold plate. As used herein, the term "heat sink" includes a component or components that help to move heat away from the one or more heat sources 158. The heat sink 160 can be supported and secured to vacuum bags 114d. The heat sink 160 can be secured to the vacuum bags 114d using solder, adhesive, tape, a weld, or some other type of fastener or coupling means, or some other means of securing the heat sink 160 to the vacuum bags 114d. In some examples, the vacuum bags 114d do not include a vacuum bag support (e.g., the vacuum bag support 130) and have a structure similar to a vacuum tube (e.g., the vacuum tube 128). In other examples, the vacuum bags 114d do include a vacuum bag support similar to the vacuum bag support 130. The vacuum bags 114d can be secured to the support structure 106 using solder, adhesive, tape, a weld, or some other type of fastener or coupling means, or some other means of attaching the vacuum bags 114d to the support structure 106.

FIG. 10A illustrates the vacuum bag 114d before a vacuum is created in the vacuum bag 114d. FIG. 10B illustrates the vacuum bag 114d after a vacuum is created in the vacuum bag 114d. The vacuum can be created in the vacuum bag 114d using the vacuum valve 144 and vacuum pump 154 (illustrated in FIG. 9A) or by some other means of creating the vacuum in the vacuum bag 114d.

The vacuum created in the vacuum bag 114d is less than one (1) ATM. In an example, the pressure inside the vacuum bag 114d is equal to or below about 0.9 ATM. In other examples, the pressure inside the vacuum bag 114d is equal to or below about 0.7 ATM. In some examples, the pressure inside the vacuum bag 114d is between about 0.9 ATM to about 0.2 ATM and ranges therein (e.g., between about 0.7 ATM and about 0.5 ATM, or between about 0.6 ATM and about 0.3 ATM), depending on design choice and design constraints. More specifically, when the vacuum is created inside the vacuum bag 114d, the vacuum bag 114d will deform and collapse. Because the vacuum bag 114d is secured to the support structure 106, the deformation and collapse of the vacuum bag 114d causes the heat sink 160, which is attached to the vacuum bag 114d, to move in the direction of the one or more heat sources 158 and the TIM 126 and create an applied load on the TIM 126 and the one or more heat sources 158. The greater the size of the vacuum bag 114d and/or the greater the vacuum created in the vacuum bag 114d, the greater the applied load on the TIM 126 and the one or more heat sources 158.

As illustrated in FIG. 10B, the vacuum bag 114d does not extend the entire length around the one or more heat sources 158 so the TIM 126 between the one or more heat sources 158 and the heat sink 160 will not be subjected to sub-atmospheric pressure to help minimize vaporization of the TIM. The vacuum bag 114d can be hermetically sealed to help prevent the penetration of liquid vapor into the vacuum bag 114d. The vacuum bag 114d can help provide a vacuum-based mechanical loading approach that helps to create an applied load on the TIM 126 and the one or more heat sources 158 without creating holes in support structure 106. While FIG. 10B illustrates two vacuum bags 114d, in some examples, more than two vacuum bags 114d may be on the support structure 106 and secured to the heat sink 160, depending on design constraints and design choice.

Turning to FIG. 11, FIG. 11 is an example flowchart illustrating possible operations of a flow 1100 that may be associated with a vacuum-based attachment for a heat sink and a radiation shield, in accordance with an embodiment. At 1102, a source of radiation on a support structure is identified. For example, the one or more radiation sources 108 on the support structure 106 can be identified as a source of radiation. At 1104, a radiation shield wall is created around the source of radiation and the radiation shield wall is grounded. For example, the radiation shield wall 116 can be created or placed around the one or more radiation sources 108 on the support structure 106. The radiation shield wall 116 can be grounded to the ground 124. At 1106, a lid with a vacuum bag is secured to the radiation shield wall to create a radiation shield around the source of radiation. For example, the lid 112 can be attached to the vacuum bag 114 and the vacuum bag 114 can be secured to the radiation shield wall 116 to create the radiation shield 110 around the one or more radiation sources 108. At 1108, a vacuum is created in the vacuum bag to deform and collapse the vacuum bag and create an applied load on the source of radiation. For example, using the vacuum pump 154 and vacuum valve 144, a vacuum is created in the vacuum bag 114 to deform and collapse the vacuum bag 114 (as illustrated in FIG. 2B) and to create an applied load on the one or more radiation sources 108 without creating holes in support structure 106. In an example, the lid is a cold plate and TIM 126 is over the one or more radiation sources 108 and the applied load on the TIM 126 and the one or more radiation sources 108 helps to transfer heat generated by the one or more radiation sources 108 to the cold plate.

Figure 12:
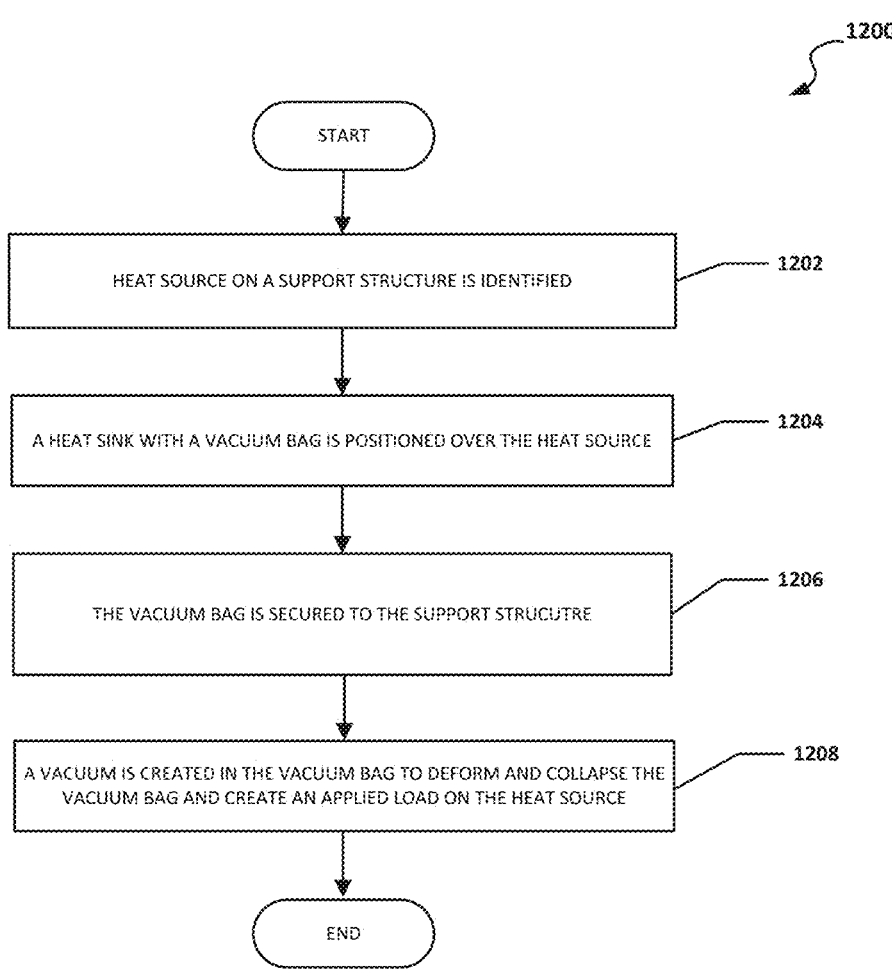
FIG. 12 is a simplified flowchart illustrating potential operations that may be associated with the system in accordance with an embodiment of the present disclosure.

Turning to FIG. 12, FIG. 12 is an example flowchart illustrating possible operations of a flow 1200 that may be associated with a creating an applied load on a heat source with a vacuum-based attachment, in accordance with an embodiment. At 1202, a heat source on a support structure is identified. For example, the one or more heat sources 158 on the support structure 106 can be identified. At 1204, a heat sink with a vacuum bag is positioned over the heat source. For example, the heat sink 160 with the vacuum bag 114d can be positioned over the one or more heat sources 158. At 1206, the vacuum bag is secured to the support structure. For example, the vacuum bag 114d can be secured to the support structure 106. At 1208, a vacuum is created in the vacuum bag to deform and collapse the vacuum bag and create an applied load on the one or more heat sources. For example, using the vacuum pump 154 and vacuum valve 144, a vacuum is created in the vacuum bag 114d to deform and collapse the vacuum bag 114d (as illustrated in FIG. 10B) and to create an applied load on the one or more heat sources 158 without creating holes in support structure 106. In an example, TIM 126 is over the one or more heat sources 158 and the applied load on the TIM 126 and the one or more heat sources 158 helps to transfer heat generated by the one or more heat sources 158 to the heat sink 160.

Figure 13:
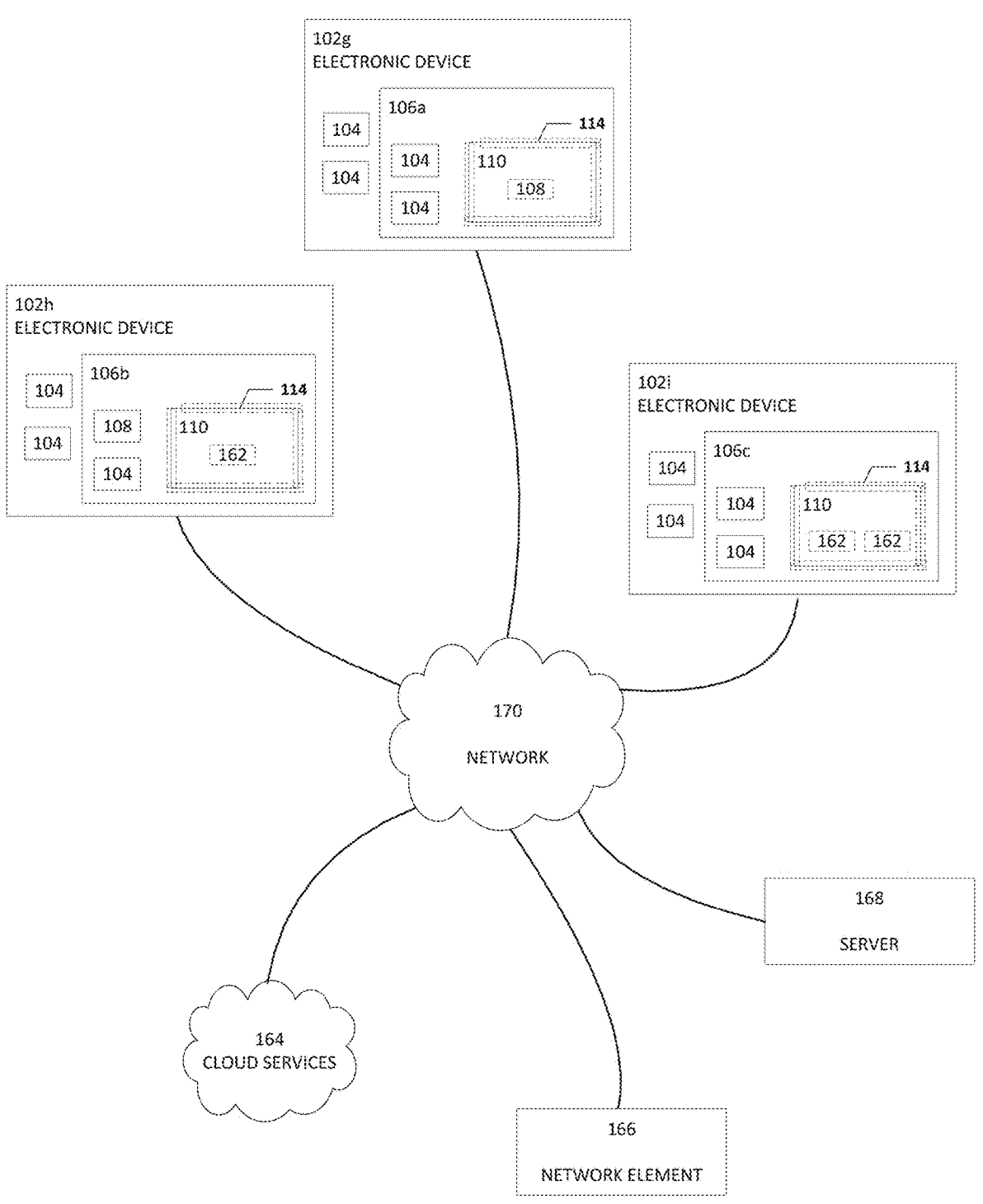
FIG. 13 is a block diagram illustrating example devices that include a vacuum-based attachment for a heat sink and a radiation shield, in accordance with an embodiment of the present disclosure.

Turning to FIG. 13, FIG. 13 is a simplified block diagram of an electronic device configured with a vacuum-based attachment for a heat sink and a radiation shield, in accordance with an embodiment of the present disclosure. For example, as illustrated in FIG. 13, an electronic device 102g includes the one or more electronics 104 and a support structure 106a. The support structure 106a can include at least one of the one or more electronics 104, the radiation source 108, the radiation shield 110, and the vacuum bag 114.

In an example, the support structure 106a can be a substrate and more particularly, a PCB. The radiation source 108 can be on or over the support structure 106a and the radiation shield 110 can be over the radiation source 108 to help contain or mitigate the radiation from the radiation source 108 from extending past the radiation shield 110 or at least partially contain or mitigate the radiation from the radiation source 108 from extending past the radiation shield 110. The vacuum bag 114 can have an internal pressure that less than one (1) atmospheric pressure. The vacuum inside the vacuum bag 114 deforms and collapses the vacuum bag 114 to create an applied load on the radiation source 108.

In addition, an electronic device 102h can include one or more electronics 104 and a support structure 106b. The support structure 106b can include at least one of the one or more electronics 104, the one or more radiation sources 108, the radiation shield 110, the vacuum bag 114, and one or more radiation sensitive devices 162. In an example, the support structure 106b can be a substrate and more particularly, a PCB.

The radiation shield 110 can be over the one or more radiation sensitive devices 162 to help shield the one or more radiation sensitive devices 162 from the radiation from the one or more radiation sources 108 or mitigate the effects of the radiation from the one or more radiation sources 108 from effecting the one or more radiation sensitive devices 162 or at least partially mitigate the effects of the radiation from the one or more radiation sources 108 on the one or more radiation sensitive devices 162. The vacuum bag 114 can have an internal pressure that less than one (1) atmospheric pressure. The vacuum inside the vacuum bag 114 deforms and collapses the vacuum bag 114 to create an applied load on the one or more radiation sensitive devices 162.

Also, an electronic device 102i includes one or more electronics 104 and a support structure 106c. The support structure 106c can include at least one of the one or more electronics 104, the radiation shield 110, the vacuum bag 114, and the one or more radiation sensitive devices 162. In an example, the support structure 106e can be a substrate and more particularly, a PCB.

The radiation shield 110 can be over the one or more radiation sensitive devices 162 to help shield the one or more radiation sensitive devices 162 from the radiation from outside of the electronic device 102i or mitigate the effects of the radiation from outside of the electronic device 102i from effecting the one or more radiation sensitive devices 162 or at least partially mitigate the effects of the radiation from outside of the electronic device 102i on the one or more radiation sensitive devices 162. The vacuum bag 114 can have an internal pressure that less than one (1) atmospheric pressure. The vacuum inside the vacuum bag 114 deforms and collapses the vacuum bag 114 to create an applied load on the one or more radiation sensitive devices 162.

Each of electronic devices 102g-102i (and electronic devices 102 and 102a-102f) may be in communication with each other, cloud services 164, network element 166, and/or server 168 using network 170. In some examples, one or more of electronic devices 102g-102i (and electronic devices 102 and 102a-102f) may be standalone devices and not connected to network 170 or another device.

Elements of FIG. 13 may be coupled to one another through one or more interfaces employing any suitable connections (wired or wireless), which provide viable pathways for network (e.g., network 170) communications. Additionally, any one or more of these elements of FIG. 13 may be combined or removed from the architecture based on particular configuration needs. Network 170 may include a configuration capable of transmission control protocol/Internet protocol (TCP/IP) communications for the transmission or reception of packets in a network. Each of electronic devices 102g-102i (and electronic devices 102 and 102a-102f) may also operate in conjunction with a user datagram protocol/IP (UDP/IP) or any other suitable protocol where appropriate and based on particular needs.

Turning to the network infrastructure of FIG. 13, network 170 represents a series of points or nodes of interconnected communication paths for receiving and transmitting packets of information. Network 170 offers a communicative interface between nodes, and may be configured as any local area network (LAN), virtual local area network (VLAN), wide area network (WAN), wireless local area network (WLAN), metropolitan area network (MAN), Intranet, Extranet, virtual private network (VPN), and any other appropriate architecture or system that facilitates communications in a network environment, or any suitable combination thereof, including wired and/or wireless communication.

In network 170, network traffic, which is inclusive of packets, frames, signals, data, etc., can be sent and received according to any suitable communication messaging protocols. Suitable communication messaging protocols can include a multi-layered scheme such as Open Systems Interconnection (OSI) model, or any derivations or variants thereof (e.g., Transmission Control Protocol/Internet Protocol (TCP/IP), user datagram protocol/IP (UDP/IP)). Messages through the network could be made in accordance with various network protocols, (e.g., Ethernet, Infiniband, OmniPath, etc.). Additionally, radio signal communications over a cellular network may also be provided. Suitable interfaces and infrastructure may be provided to enable communication with the cellular network.

The term "packet" as used herein, refers to a unit of data that can be routed between a source node and a destination node on a packet switched network. A packet includes a source network address and a destination network address. These network addresses can be Internet Protocol (IP) addresses in a TCP/IP messaging protocol. The term "data" as used herein, refers to any type of binary, numeric, voice, video, textual, or script data, or any type of source or object code, or any other suitable information in any appropriate format that may be communicated from one point to another in electronic devices and/or networks.

In an example implementation, electronic devices 102 and 102a-102i are meant to encompass a computer, a personal digital assistant (PDA), a laptop or electronic notebook, a cellular telephone, a smartphone, an IP phone, Internet of Things (IoT) device, network elements, network appliances, servers, routers, switches, gateways, bridges, load balancers, processors, modules, or any other device, component, element, or object that includes a radiation source and/or a radiation sensitive device. Each of electronic devices 102 and 102a-102i may include any suitable hardware, software, components, modules, or objects that facilitate the operations thereof, as well as suitable interfaces for receiving, transmitting, and/or otherwise communicating data or information in a network environment. This may be inclusive of appropriate algorithms and communication protocols that allow for the effective exchange of data or information. Each of electronic devices 102 and 102a-102i may include virtual elements.

In regards to the internal structure, each of electronic devices 102 and 102a-102i can include memory elements for storing information to be used in operations. Each of electronic devices 102a-102d may keep information in any suitable memory element (e.g., random access memory (RAM), read-only memory (ROM), erasable programmable ROM (EPROM), electrically erasable programmable ROM (EEPROM), application specific integrated circuit (ASIC), etc.), software, hardware, firmware, or in any other suitable component, device, element, or object where appropriate and based on particular needs. Any of the memory items discussed herein should be construed as being encompassed within the broad term 'memory element.' Moreover, the information being used, tracked, sent, or received could be provided in any database, register, queue, table, cache, control list, or other storage structure, all of which can be referenced at any suitable timeframe. Any such storage options may also be included within the broad term 'memory element' as used herein.

In certain example implementations, functions may be implemented by logic encoded in one or more tangible media (e.g., embedded logic provided in an ASIC, digital signal processor (DSP) instructions, software (potentially inclusive of object code and source code) to be executed by a processor, or other similar machine, etc.), which may be inclusive of non-transitory computer-readable media. In some of these instances, memory elements can store data used for operations. This includes the memory elements being able to store software, logic, code, or processor instructions that are executed to carry out operations or activities.

Additionally, each of electronic devices 102 and 102a-102i can include one or more processors that can execute software or an algorithm. In one example, the processors could transform an element or an article (e.g., data) from one state or thing to another state or thing. In another example, activities may be implemented with fixed logic or programmable logic (e.g., software/computer instructions executed by a processor) and the elements identified herein could be some type of a programmable processor, programmable digital logic (e.g., a field programmable gate array (FPGA), an erasable programmable read-only memory (EPROM), an electrically erasable programmable read-only memory (EEPROM)) or an ASIC that includes digital logic, software, code, electronic instructions, or any suitable combination thereof. Any of the potential processing elements, modules, and machines described herein should be construed as being encompassed within the broad term 'processor.'

Implementations of the embodiments disclosed herein may be formed or carried out on or over a substrate, such as a non-semiconductor substrate or a semiconductor substrate. In one implementation, the non-semiconductor substrate may be silicon dioxide, an inter-layer dielectric composed of silicon dioxide, silicon nitride, titanium oxide and other transition metal oxides. Although a few examples of materials from which the non-semiconducting substrate may be formed are described here, any material that may serve as a foundation upon which a non-semiconductor device may be built falls within the spirit and scope of the embodiments disclosed herein.

In another implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. In other examples, the substrate may be a flexible substrate including 2D materials such as graphene and molybdenum disulphide, organic materials such as pentacene, transparent oxides such as indium gallium zinc oxide poly/amorphous (low temperature of dep) III-V semiconductors and germanium/silicon, and other non-silicon flexible substrates. Although a few examples of materials from which the substrate may be formed are described here, any material that may serve as a foundation upon which a semiconductor device may be built falls within the spirit and scope of the embodiments disclosed herein.

Note that with the examples provided herein, interaction may be described in terms of one, two, three, or more elements. However, this has been done for purposes of clarity and example only. In certain cases, it may be easier to describe one or more of the functionalities by only referencing a limited number of elements. It should be appreciated that electronic devices 102 and 102a-102i and their teachings are readily scalable and can accommodate a large number of components, as well as more complicated/sophisticated arrangements and configurations. Accordingly, the examples provided should not limit the scope or inhibit the broad teachings of electronic devices 102 and 102a-102i and as potentially applied to a myriad of other architectures. For example, the vacuum bag 114d may include a support structure similar to the vacuum bag 114 illustrated in FIG. 3. In addition, the vacuum bag 114 illustrated in FIG. 3 may not include a support structure and may have a similar structure to the vacuum bag 114d illustrated in FIGS. 10A and 10B.

Although the present disclosure has been described in detail with reference to particular arrangements and configurations, these example configurations and arrangements may be changed significantly without departing from the scope of the present disclosure. Moreover, certain components may be combined, separated, eliminated, or added based on particular needs and implementations. Additionally, although electronic devices 102 and 102a-102i have been illustrated with reference to particular elements and operations, these elements and operations may be replaced by any suitable architecture, protocols, and/or processes that achieve the intended functionality of electronic devices 102 and 102a-102i.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES AND EXAMPLES

In Example A1, is an electronic device including a support structure, a radiation source on the support structure, and a radiation shield around the radiation source. The radiation shield includes a wall secured to the support structure, a vacuum bag on the wall, where the vacuum bag has an inside air pressure less than an air pressure outside the vacuum bag, and a lid.

In Example A2, the subject matter of Example A1 can optionally include where the radiation source is a heat source and the lid is a cold plate.

In Example A3, the subject matter of Example A2 can optionally include thermal interface material (TIM) between the radiation source and the lid, wherein the vacuum bag creates an applied load on the TIM and the radiation source.

In Example A4, the subject matter of Example A1 can optionally include where the vacuum bag does not fully extend on the wall to allow an environment inside the radiation shield to have a same pressure as an environment outside of the radiation shield.

In Example A5, the subject matter of Example A1 can optionally include where the air pressure inside the vacuum bag is equal to or below about 0.9 atmospheric pressure.

In Example A6, the subject matter of Example A1 can optionally include where the air pressure inside the vacuum bag is equal to or below about 0.5 atmospheric pressure.

In Example A7, the subject matter of Example A1 can optionally include where the vacuum bag is secured to the wall using a securing hook that extends into the wall.

In Example A8, the subject matter of Example A1 can optionally include where the radiation shield is grounded to a ground plane in the support structure.

In Example A9, the subject matter of any one of Examples A1-A2 can optionally include thermal interface material (TIM) between the radiation source and the lid, wherein the vacuum bag creates an applied load on the TIM and the radiation source.

In Example A10, the subject matter of any one of Examples A1-A3 can optionally include where the vacuum bag does not fully extend on the wall to allow an environment inside the radiation shield to have a same pressure as an environment outside of the radiation shield.

In Example A11, the subject matter of any one of Examples A1-A4 can optionally include where the air pressure inside the vacuum bag is equal to or below about 0.9 atmospheric pressure.

In Example A12, the subject matter of any one of Examples A1-A5 can optionally include where the air pressure inside the vacuum bag is equal to or below about 0.5 atmospheric pressure.

In Example A13, the subject matter of any one of Examples A1-A6 can optionally include where the vacuum bag is secured to the wall using a securing hook that extends into the wall.

In Example A14, the subject matter of any one of Examples A1-A7 can optionally include where the radiation shield is grounded to a ground plane in the support structure.

Example AA1 is a radiation shield including a wall that is secured to a surface of a support structure, a vacuum bag secured to the wall, wherein the vacuum bag has an inside air pressure less than an atmospheric air pressure outside the vacuum bag, and a lid secured to the vacuum bag.

In Example AA2, the subject matter of Example AA1 can optionally include where the vacuum bag includes a vacuum tube and a vacuum bag support.

In Example AA3, the subject matter of Example AA1 can optionally include where the vacuum bag support includes support material.

In Example AA4, the subject matter of Example AA1 can optionally include where the vacuum bag support includes a securing hook.

In Example AA5, the subject matter of Example AA1 can optionally include where the wall includes an attachment surface that couples with the securing hook to secure the vacuum bag to the wall.

In Example AA6, the subject matter of Example AA1 can optionally include where the wall, the vacuum bag, and the lid define an interior space of the radiation shield, the interior space housing a radiation source that emits electromagnetic interference (EMI) and/or radio-frequency interference (RFI).

In Example AA7, the subject matter of any one of Examples AA1-AA2 can optionally include where the vacuum bag support includes support material.

In Example AA8, the subject matter of any one of Examples AA1-AA3 can optionally include where the vacuum bag support includes a securing hook.

In Example AA9, the subject matter of any one of Examples AA1-AA4 can optionally include where the wall includes an attachment surface that couples with the securing hook to secure the vacuum bag to the wall.

In Example AA10, the subject matter of any one of Examples AA1-AA5 can optionally include where the wall, the vacuum bag, and the lid define an interior space of the radiation shield, the interior space housing a radiation source that emits electromagnetic interference (EMI) and/or radio-frequency interference (RFI).

Example M1 is a method including identifying a radiation source on a printed circuit board, creating a wall around the radiation source, securing a vacuum bag to the wall, wherein a lid is secured to the vacuum bag, and creating a vacuum in the vacuum bag to deform and collapse at least a portion of the vacuum bag and cause an applied load to be generated on the radiation source from the lid.

In Example M2, the subject matter of Example M1 can optionally include coupling the wall to a ground plane in the printed circuit board.

In Example M3, the subject matter of Example M1 can optionally include where after the vacuum is created in the vacuum bag, an air pressure inside the vacuum bag is equal to or below about 0.7 atmospheric pressure.

In Example M4, the subject matter of Example M1 can optionally include plugging a valve that was used to create the vacuum in the vacuum bag such that air cannot reenter the vacuum bag.

In Example M5, the subject matter of Example M4 can optionally include where after the valve is plugged, the vacuum bag has an inside air pressure less than an air pressure outside the vacuum bag.

In Example M6, the subject matter of Example M1 can optionally include where the radiation source is a heat source and the lid is a cold plate.

In Example M7, the subject matter of any one of the Examples M1-M2 can optionally include where after the vacuum is created in the vacuum bag, an air pressure inside the vacuum bag is equal to or below about 0.7 atmospheric pressure.

In Example M8, the subject matter of any one of the Examples M1-M3 can optionally include plugging a valve that was used to create the vacuum in the vacuum bag such that air cannot reenter the vacuum bag.

In Example M9, the subject matter of any one of the Examples M1-M4 can optionally include where after the valve is plugged, the vacuum bag has an inside air pressure less than an air pressure outside the vacuum bag.

In Example M10, the subject matter of any one of the Examples M1-M5 can optionally include where the radiation source is a heat source and the lid is a cold plate.

Example AAA1 is an electronic device including a support structure, a heat source on the support structure, a vacuum bag on the support structure, where the vacuum bag has an inside air pressure less than an air pressure outside the vacuum bag, and a cold plate over the heat source, where the vacuum bag causes the cold plate to apply a load on the heat source.

In Example AAA2, the subject matter of Example AAA1 can optionally include where the cold plate is a vapor chamber.

In Example AAA3, the subject matter of Example AAA1 can optionally include where thermal interface material (TIM) between the radiation source and the lid, where the vacuum bag causes the cold plate to apply a load on the TIM and the heat source.

In Example AAA4, the subject matter of Example AAA1 can optionally include where the air pressure inside the vacuum bag is equal to or below about 0.9 atmospheric pressure.

In Example AAA5, the subject matter of Example AAA1 can optionally include where the air pressure inside the vacuum bag is equal to or below about 0.7 atmospheric pressure.

In Example AAA6, the subject matter of Example AAA1 can optionally include where the air pressure inside the vacuum bag is equal to or below about 0.5 atmospheric pressure.

In Example AAA7, the subject matter of Example AAA1 can optionally include where the vacuum bag is secured to the support structure using solder.

In Example AAA8, the subject matter of Example AAA1 can optionally include where the vacuum bag is secured to the cold plate using solder.

In Example AAA9, the subject matter of Example AAA1 can optionally include where the vacuum bag includes a vacuum tube and a vacuum bag support.

In Example AAA10, the subject matter of Example AAA1 can optionally include where the vacuum bag support includes support material.

In Example AAA11, the subject matter of Example AAA1 can optionally include a valve to extract air from the vacuum bag.

In Example AAA12, the subject matter of Example AAA1 can optionally include a plug to plug the valve after the air has been extracted from the vacuum bag to create the vacuum in the vacuum bag such that air cannot reenter the vacuum bag.

In Example AAA13, the subject matter of Example AAA1 can optionally include where after the valve is plugged, the vacuum bag has an inside air pressure less than an air pressure outside the vacuum bag.

In Example AAA14, the subject matter of any one of Examples AAA1-AAA2 can optionally include where thermal interface material (TIM) between the radiation source and the lid, where the vacuum bag causes the cold plate to apply a load on the TIM and the heat source.

In Example AA15, the subject matter of any one of Examples AAA1-AAA3 can optionally include where the air pressure inside the vacuum bag is equal to or below about 0.9 atmospheric pressure.

In Example AAA16, the subject matter of any one of Examples AAA1-AAA4 can optionally include where the air pressure inside the vacuum bag is equal to or below about 0.7 atmospheric pressure.

In Example AAA17, the subject matter of any one of Examples AAA1-AAA5 can optionally include where the air pressure inside the vacuum bag is equal to or below about 0.5 atmospheric pressure.

In Example AAA18, the subject matter of any one of Examples AAA1-AAA6 can optionally include where the vacuum bag is secured to the support structure using solder.

In Example AAA19, the subject matter of any one of Examples AAA1-AAA1 can optionally include where the vacuum bag is secured to the cold plate using solder.

In Example AAA20, the subject matter of any one of Examples AAA1-AAA8 can optionally include where the vacuum bag includes a vacuum tube and a vacuum bag support.

In Example AAA21, the subject matter of any one of Examples AAA1-AAA9 can optionally include where the vacuum bag support includes support material.

In Example AAA22, the subject matter of any one of Examples AAA1-AAA10 can optionally include a valve to extract air from the vacuum bag.

In Example AAA23, the subject matter of any one of Examples AAA1-AAA11 can optionally include a plug to plug the valve after the air has been extracted from the vacuum bag to create the vacuum in the vacuum bag such that air cannot reenter the vacuum bag.

In Example AAA24, the subject matter of any one of Examples AAA1-AAA12 can optionally include where after the valve is plugged, the vacuum bag has an inside air pressure less than an air pressure outside the vacuum bag.

What is claimed is:

1. An electronic device comprising:
a support structure;
a radiation source on the support structure; and
a radiation shield around the radiation source, wherein the radiation shield includes:
a wall secured to the support structure;
a vacuum bag on the wall, wherein the vacuum bag has an inside air pressure less than an air pressure outside the vacuum bag; and
a lid.

2. The electronic device of claim 1, wherein the radiation source is a heat source and the lid is a cold plate.

3. The electronic device of claim 2, further comprising:
thermal interface material (TIM) between the radiation source and the lid, wherein the vacuum bag creates an applied load on the TIM and the radiation source.

4. The electronic device of claim 1, wherein the vacuum bag does not fully extend on the wall to allow an environment inside the radiation shield to have a same pressure as an environment outside of the radiation shield.

5. The electronic device of claim 1, wherein the air pressure inside the vacuum bag is equal to or below about 0.9 atmospheric pressure.

6. The electronic device of claim 1, wherein the air pressure inside the vacuum bag is equal to or below about 0.5 atmospheric pressure.

7. The electronic device of claim 1, wherein the vacuum bag is secured to the wall using a securing hook that extends into the wall.

8. The electronic device of claim 1, wherein the radiation shield is grounded to a ground plane in the support structure.

9. A radiation shield comprising:
a wall that is secured to a surface of a support structure;
a vacuum bag secured to the wall, wherein the vacuum bag has an inside air pressure less than an atmospheric air pressure outside the vacuum bag; and
a lid secured to the vacuum bag.

10. The radiation shield of claim 9, wherein the vacuum bag includes a vacuum tube and a vacuum bag support.

11. The radiation shield of claim 10, wherein the vacuum bag support includes support material.

12. The radiation shield of claim 10, wherein the vacuum bag support includes a securing hook.

13. The radiation shield of claim 12, wherein the wall includes an attachment surface that couples with the securing hook to secure the vacuum bag to the wall.

14. The radiation shield of claim 9, wherein the wall, the vacuum bag, and the lid define an interior space of the radiation shield, the interior space housing a radiation source that emits electromagnetic interference (EMI) and/or radio-frequency interference (RFI).

15. A method comprising:
identifying a radiation source on a printed circuit board;
creating a wall around the radiation source;
securing a vacuum bag to the wall, wherein a lid is secured to the vacuum bag; and
creating a vacuum in the vacuum bag to deform and collapse at least a portion of the vacuum bag and cause an applied load to be generated on the radiation source from the lid.

16. The method of claim 15, further comprising:
coupling the wall to a ground plane in the printed circuit board.

17. The method of claim 15, wherein after the vacuum is created in the vacuum bag, an air pressure inside the vacuum bag is equal to or below about 0.7 atmospheric pressure.

18. The method of claim 15, further comprising:
plugging a valve that was used to create the vacuum in the vacuum bag such that air cannot reenter the vacuum bag.

19. The method of claim 18, wherein after the valve is plugged, the vacuum bag has an inside air pressure less than an air pressure outside the vacuum bag.

20. The method of claim 19, wherein the radiation source is a heat source and the lid is a cold plate.

* * * * *